(12) United States Patent
Shterzer

(10) Patent No.: US 12,244,313 B2
(45) Date of Patent: Mar. 4, 2025

(54) PULSE FORMING NETWORK (PFN) HAVING MULTIPLE CAPACITOR UNITS AND A COMMON PASSIVE OUTPUT CIRCUIT FOR FORMING A PULSE HAVING A MULTI-LEVEL VOLTAGE AND A METHOD OF FORMING SUCH A PULSE

(71) Applicants: Moshe Shterzer, Herzliya (IL); Antoni Waldemar Koszykowski, Wisbech (GB)

(72) Inventor: Moshe Shterzer, Herzliya (IL)

(73) Assignees: Moshe Shterzer, Herzliya (IL); Antoni Waldemar Koszykowski, Wisbech (GB)

( * ) Notice: Subject to any disclaimer, the term of this patent is extended or adjusted under 35 U.S.C. 154(b) by 55 days.

(21) Appl. No.: 17/441,317

(22) PCT Filed: Mar. 10, 2020

(86) PCT No.: PCT/IL2020/050280
§ 371 (c)(1),
(2) Date: Sep. 21, 2021

(87) PCT Pub. No.: WO2020/194290
PCT Pub. Date: Oct. 1, 2020

(65) Prior Publication Data
US 2022/0182046 A1 Jun. 9, 2022

Related U.S. Application Data

(60) Provisional application No. 62/822,910, filed on Mar. 24, 2019.

(51) Int. Cl.
*H03K 3/57* (2006.01)
*H02M 3/158* (2006.01)

(52) U.S. Cl.
CPC .............. *H03K 3/57* (2013.01); *H02M 3/158* (2013.01)

(58) Field of Classification Search
CPC ................................. H03K 3/57; H02M 3/158
See application file for complete search history.

(56) References Cited

U.S. PATENT DOCUMENTS 6,965,215 B2  11/2005  MacDougall
7,514,820 B2   4/2009  MacDougall et al.
(Continued)

FOREIGN PATENT DOCUMENTS

CN    203883690      10/2014
WO    WO 2010/141896 12/2010
(Continued)

OTHER PUBLICATIONS

International Preliminary Report on Patentability Dated Oct. 7, 2021 From the International Bureau of WIPO Re. Application No. PCT/IL2020/050280. (13 Pages).
(Continued)

*Primary Examiner* — Daniel C Puentes

(57) ABSTRACT

A pulse forming network (PFN), comprising a single common passive output circuit comprising an inductor connected in series to a load and a diode connected in parallel to the load, a plurality of capacitor units set to store a plurality of electrical charges in a plurality of working output voltages, a plurality of switches, each adapted to electrically couple a respective one of the plurality of capacitor units to the common passive output circuit electrically connecting all the switches to the load, and a control unit adapted to operate the plurality of switches to discharge the plurality of charges into the load, via the common
(Continued)

passive output circuit, in a sequence ordered to form a regulated energizing pulse having a desired multi-level voltage waveform.

23 Claims, 19 Drawing Sheets

(56) References Cited

U.S. PATENT DOCUMENTS

| | | | | |
|---|---|---|---|---|
| 2008/0036301 A1* | 2/2008 | McDonald | ............... | H03K 3/57 |
| | | | | 307/108 |
| 2014/0070787 A1* | 3/2014 | Arno | ....................... | H02M 3/02 |
| | | | | 323/304 |
| 2014/0112029 A1* | 4/2014 | Lin | ........................ | G05F 1/563 |
| | | | | 363/21.12 |
| 2014/0327426 A1* | 11/2014 | Shterzer | ................... | H03K 3/35 |
| | | | | 323/364 |
| 2019/0020189 A1* | 1/2019 | Malinowski | ............. | H02H 3/20 |

FOREIGN PATENT DOCUMENTS

| | | |
|---|---|---|
| WO | WO 2013/102902 | 7/2013 |
| WO | WO 2020/194290 | 10/2020 |

OTHER PUBLICATIONS

International Search Report and the Written Opinion Dated Jun. 23, 2020 From the International Searching Authority Re. Application No. PCT/IL2020/050280. (16 Pages).

* cited by examiner

PULSE FORMING NETWORK (PFN) HAVING MULTIPLE CAPACITOR UNITS AND A COMMON PASSIVE OUTPUT CIRCUIT FOR FORMING A PULSE HAVING A MULTI-LEVEL VOLTAGE AND A METHOD OF FORMING SUCH A PULSE

RELATED APPLICATIONS

This application is a National Phase of PCT Patent Application No. PCT/IL2020/050280 having International filing date of Mar. 10, 2021, which claims the benefit of priority under 35 USC § 119 (e) of U.S. Provisional Patent Application No. 62/822,910 filed on Mar. 24, 2019. The contents of the above applications are all incorporated by reference as if fully set forth herein in their entirety.

FIELD AND BACKGROUND OF THE INVENTION

The present invention, in some embodiments thereof, relates to a pulse forming network (PFN) and, more particularly, but not exclusively, to a PFN having multiple capacitor units and a common passive output circuit.

A pulse forming network (PFN) is an arrangement of electrical components that is set to accumulate electrical energy over a time period and releases the accumulated energy in the form of a pulse of comparatively short duration for various pulsed power applications. In practice, a PFN is charged by means of a high voltage power source, and then rapidly discharged into a load, in particular, a high power load, such as, for example, a flash lamp such as a Xenon Pulse lamp, Filament Wire and filament lamp and/or an electromagnet, or any other high power load requiring high current and/or voltages energy sources.

During the last years various PFN have been developed. For example, U.S. Pat. No. 6,965,215 describes capacitor based pulse forming networks and related methods are provided which require fewer inductors are that pulsed more frequently to provide a smaller, lower mass, and lower inductance pulse forming network having better pulse shaping characteristics than conventional pulse forming networks. In one implementation, the invention can be characterized as a capacitor based pulse forming network comprising a plurality of inductors adapted to be coupled to a load, a plurality of capacitor units, and a plurality of switches. Each switch couples a respective capacitor unit to a respective inductor, wherein multiple capacitor units are coupled to each inductor by separate switches. The switches are adapted to non-simultaneously discharge the multiple capacitor units to provide non-simultaneous pulses through a given inductor to the load and not through other inductors. The non-simultaneous pulses form at least a portion of an output pulse waveform to the load.

U.S. Pat. No. 7,514,820 describes a capacitor based pulse forming networks and methods which require fewer inductors are that pulsed more frequently to provide a smaller, lower mass, and lower inductance pulse forming network having better pulse shaping characteristics than conventional pulse forming networks. In one implementation, the invention can be characterized as a capacitor based pulse forming network comprising a plurality of inductors adapted to be coupled to a load, a plurality of capacitor units, and a plurality of switches. Each switch couples a respective capacitor unit to a respective inductor, wherein multiple capacitor units are coupled to each inductor by separate switches. The switches are adapted to non-simultaneously discharge at least some of the multiple capacitor units to provide non-simultaneous pulses through a given inductor to the load and not through other inductors. The non-simultaneous pulses form at least a portion of an output pulse waveform to the load.

SUMMARY OF THE INVENTION

According to a first aspect of the present invention there is provided a pulse forming network (PFN), comprising:
  A single common passive output circuit comprising an inductor connected in series to a load and a diode connected in parallel to the load.
  A plurality of capacitor units set to store a plurality of electrical charges in a plurality of working output voltages.
  A plurality of switches, each adapted to electrically couple a respective one of the plurality of capacitor units to the common passive output circuit electrically connecting all the switches to the load.
  A control unit adapted to operate the plurality of switches to discharge the plurality of charges into the load, via the common passive output circuit, in a sequence ordered to form a regulated energizing pulse having a desired multi-level voltage waveform.

According to a second aspect of the present invention there is provided a method of generating a patterned pulse, comprising using a control unit of a Pulse Forming Network (PFN), the control unit is adapted for:
(a) Charging a plurality of capacitor units with a plurality of charges; and
(b) Sequentially coupling the plurality of charged capacitor units to a single common passive output circuit electrically connecting all the capacitor units to the load so as to allow delivering a regulated energizing pulse having a desired multi-level voltage waveform to the load;
Wherein the common passive output circuit comprising an inductor connected in series to the load and a diode connected in parallel to the load.

In a further implementation form of the first and/or second aspects, each of the plurality of capacitor units is energized by a power source adapted to a respective one of the plurality of working output voltages.

In a further implementation form of the first and/or second aspects, one or more of the plurality of switches is configured to electrically couple a low rail of a respective capacitor unit to the common passive output circuit.

In a further implementation form of the first and/or second aspects, one or more of the plurality of switches is configured to electrically couple a high rail of a respective capacitor unit to the common passive output circuit.

In a further implementation form of the first and/or second aspects, the desired multi-level voltage waveform is constructed from the plurality of different working output voltages.

In a further implementation form of the first and/or second aspects, the energizing pulse having a square waveform.

In a further implementation form of the first and/or second aspects, each of the plurality of switches is configured to couple a respective one of the plurality of capacitor units via an anti-reverse diode.

In a further implementation form of the first and/or second aspects, the control unit is adapted to sequentially trigger the plurality of switches to receive a respective one of the plurality of electrical charges from a respective one of the plurality of capacitor units in a sequential order, forming the energizing pulse.

In a further implementation form of the first and/or second aspects, the control unit is adapted to simultaneously trigger a number of the plurality of switches to simultaneously receive multiple electrical charges from the number of capacitor units simultaneously, forming the energizing pulse.

In a further implementation form of the first and/or second aspects, the control unit receives a requested charge level for the load and selects the number of switches according to the requested charge level.

In a further implementation form of the first and/or second aspects, the control unit is adapted to monitor the pulse to identify a deviation of the waveform from one or more reference pulses and/or one or more previously recorded pulses generated by the PFN.

In a further implementation form of the first and/or second aspects, the control unit identifies a malfunction in one or more of the plurality of capacitor units according to an analysis of the waveform deviation and outputs an indication which indicates which of the plurality of capacitor units malfunctions.

In a further implementation form of the first and/or second aspects, one or more of the plurality of capacitor units are detachably connected to a supporting structure.

In a further implementation form of the first and/or second aspects, each of the plurality of capacitor units is iteratively charged.

In a further implementation form of the first and/or second aspects, the plurality of capacitor units are charged by one or more charging units electrically coupled to the plurality of capacitor units, the charging unit(s) is operated by the control unit to charge the plurality of capacitor units with a plurality of electrical charges having a plurality of voltages.

In a further implementation form of the first and/or second aspects, one or more of the charging units comprises a fly-back power controller adapted to control conversion of a rectified alternating input current to a direct current used for charging the plurality of capacitor units, the direct current is applied with current limiting to at least partially attenuate transients in the direct current. The fly-back power controller is powered by an independent auxiliary power converter adapted to convert the rectified alternating input current to a direct current configured to power the fly-back power controller.

In a further implementation form of the first and/or second aspects, one or more of the charging units comprises a buck-boost converter.

In a further implementation form of the first and/or second aspects, the control unit operates the buck-boost converter to charge the plurality of capacitor units with an approximately linearly rising voltage level.

In a further implementation form of the first and/or second aspects, the buck-boost converter is electrically coupled to a respective one of the plurality of capacitor units via a charging switch triggered by the control unit according to a respective electrical charge defined for the respective capacitor unit.

In a further implementation form of the first and/or second aspects, the charging switch is configured to electrically couple a low rail of the buck-boost converter to the respective capacitor unit.

In a further implementation form of the first and/or second aspects, the charging switch is configured to electrically couple a high rail of the buck-boost converter to the respective capacitor unit.

In an optional implementation form of the first and/or second aspects, the boost circuit of the buck-boost converter is disabled by operating a switch of the buck-boost converter to constantly electrically couple the boost converter circuit to the respective capacitor unit.

In an optional implementation form of the second aspect, the control unit is adapted to repeat the operations (a) and (b) so as to charge the load continuously.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL
VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 7A:
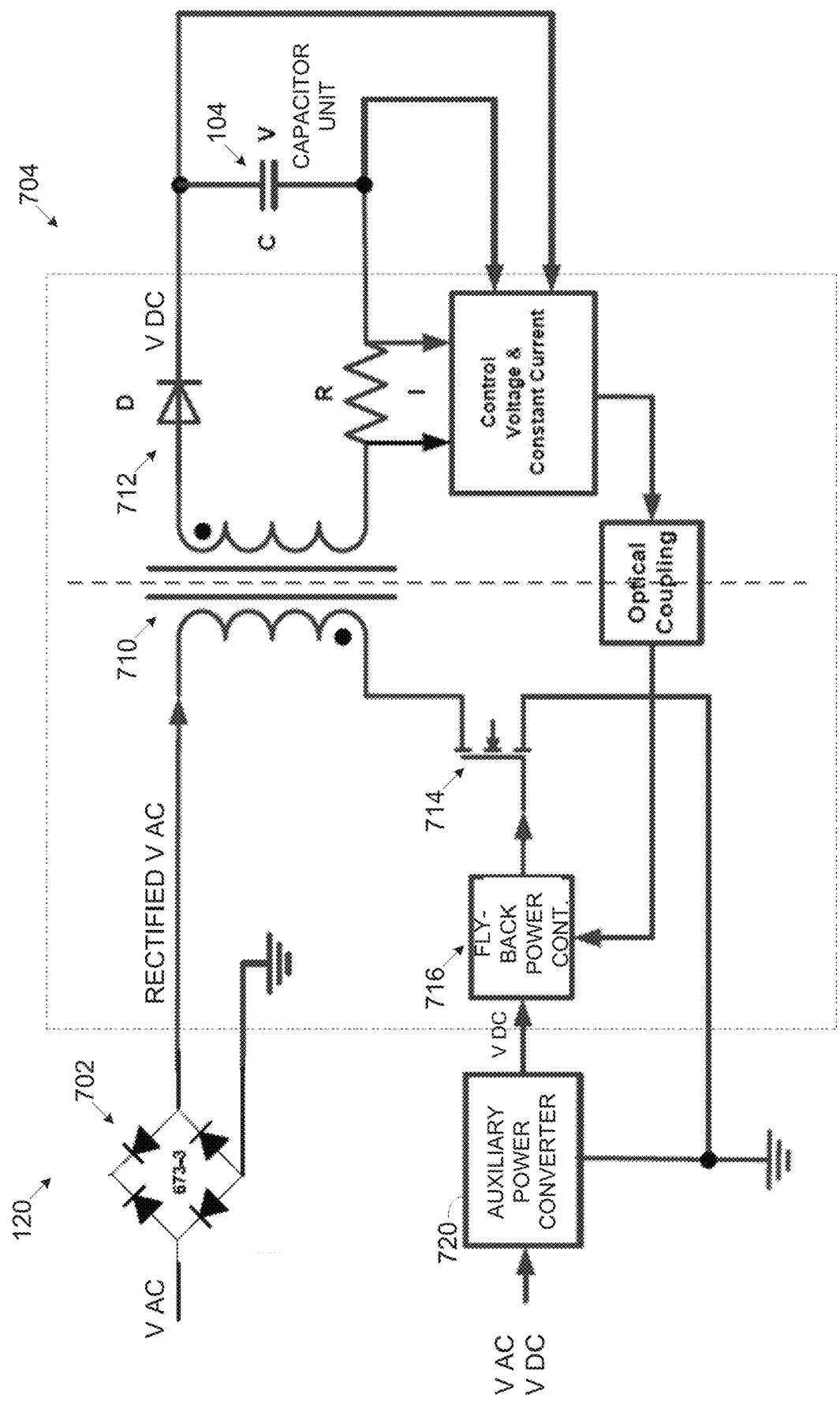
FIG. 7A is a schematic illustration of an exemplary isolated power supply comprising a fly-back power controller powered by an independent auxiliary power converter, according to some embodiments of the present invention.
Figure 7B:
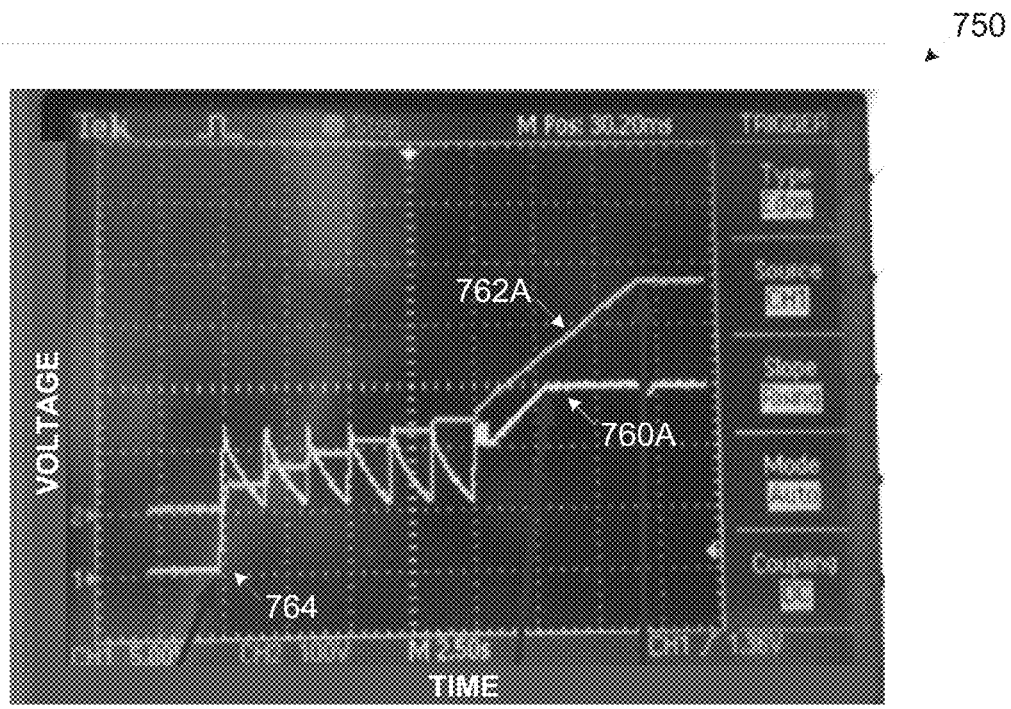
FIG. 7B is a graph chart of a power up sequence of a legacy fly-back power controller circuit.
Figure 7C:
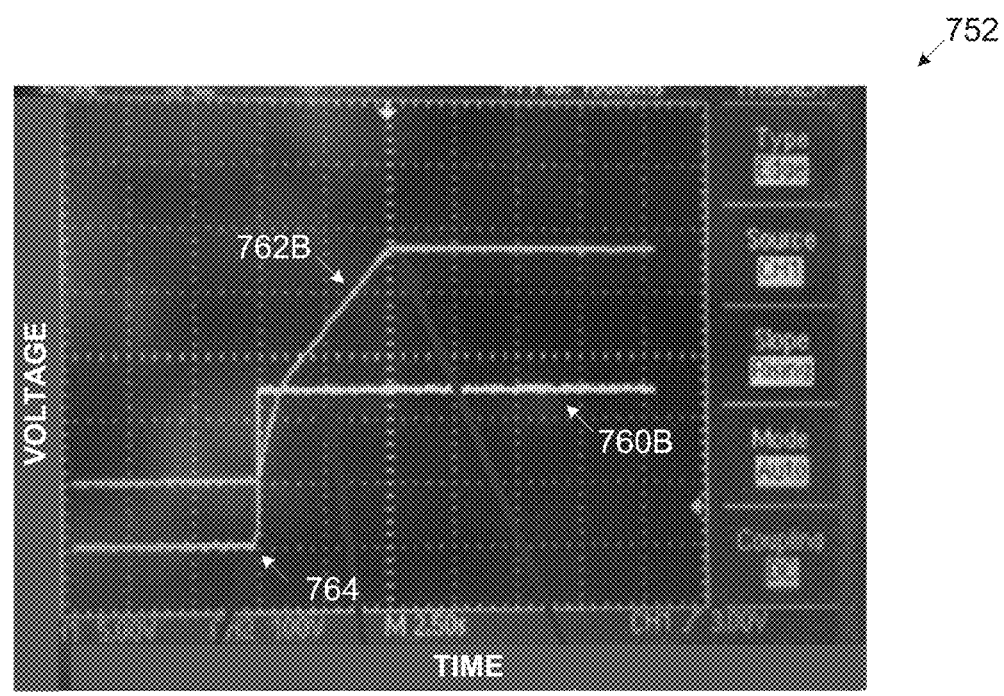
Figure 8A:
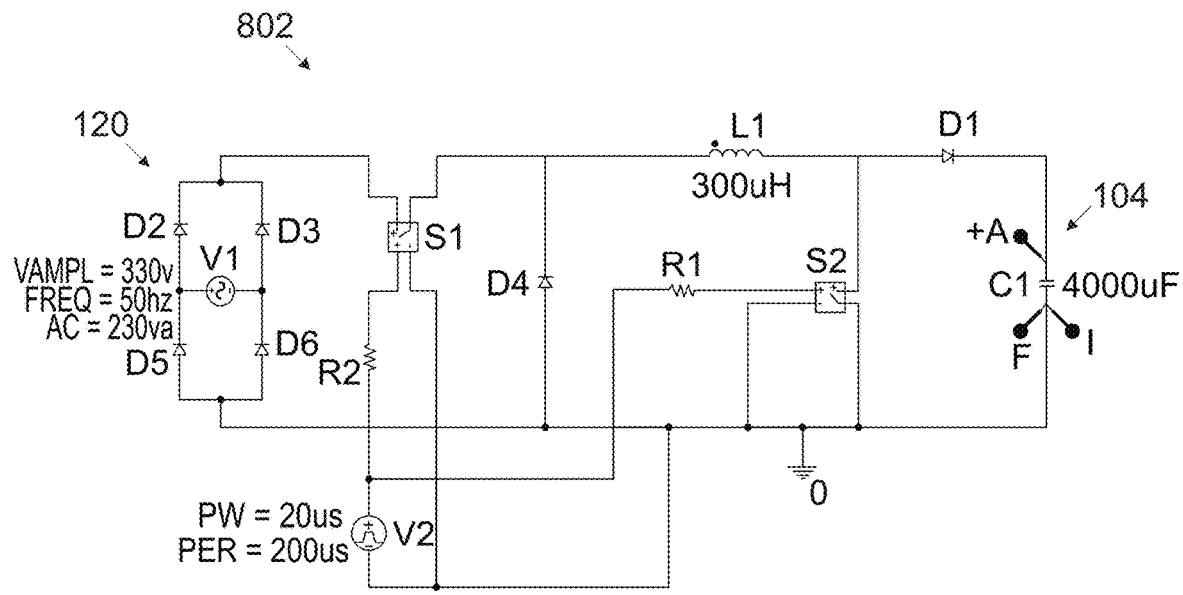
Figure 8B:
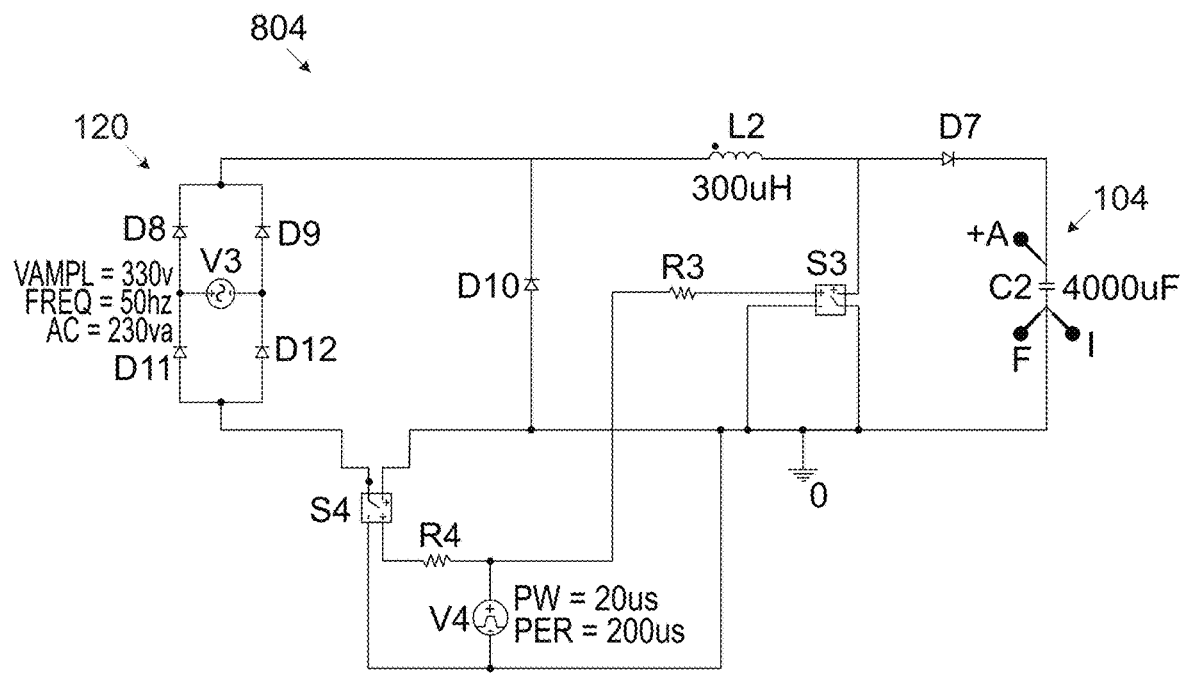
Figure 9:
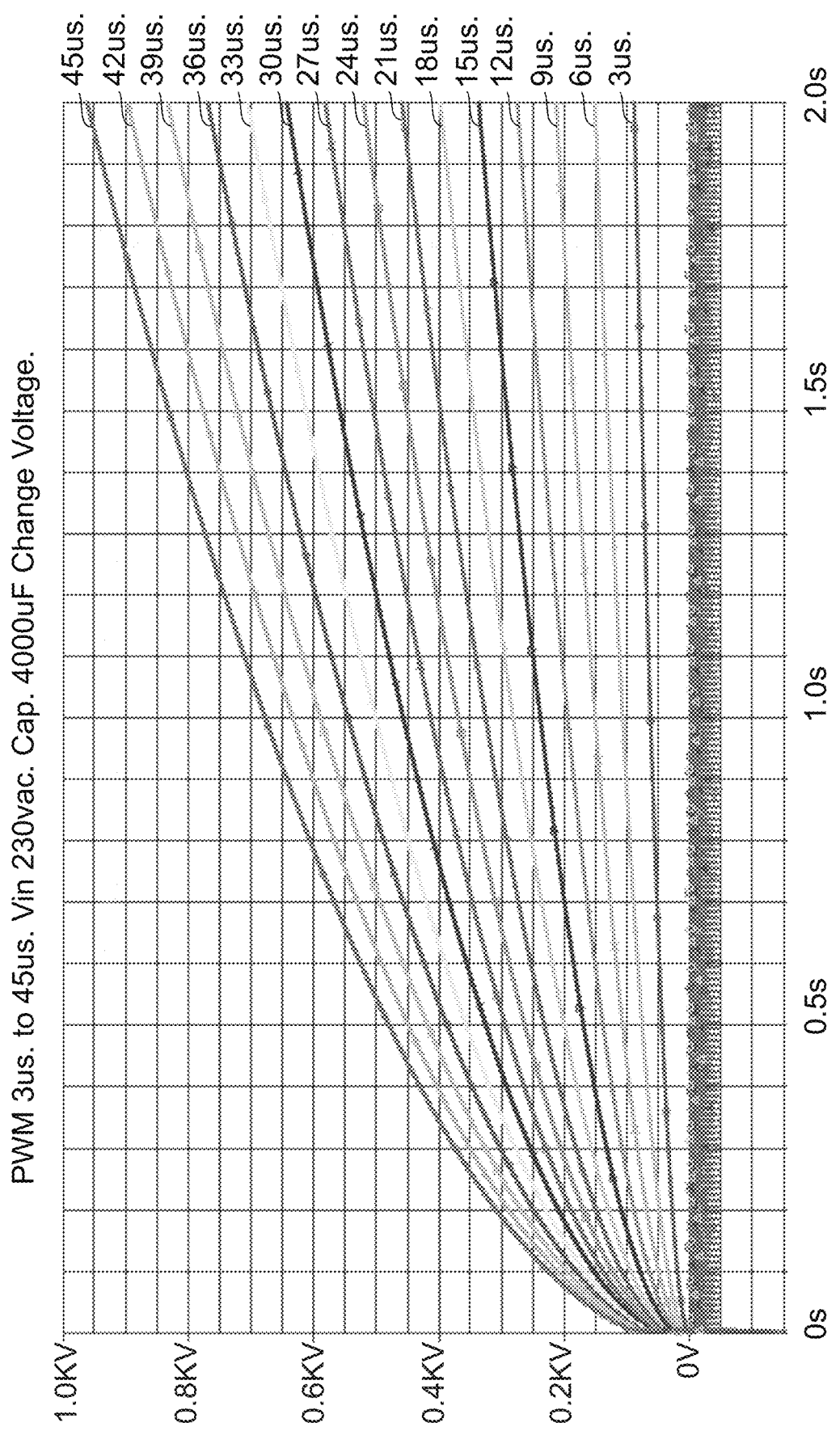
Figure 10:
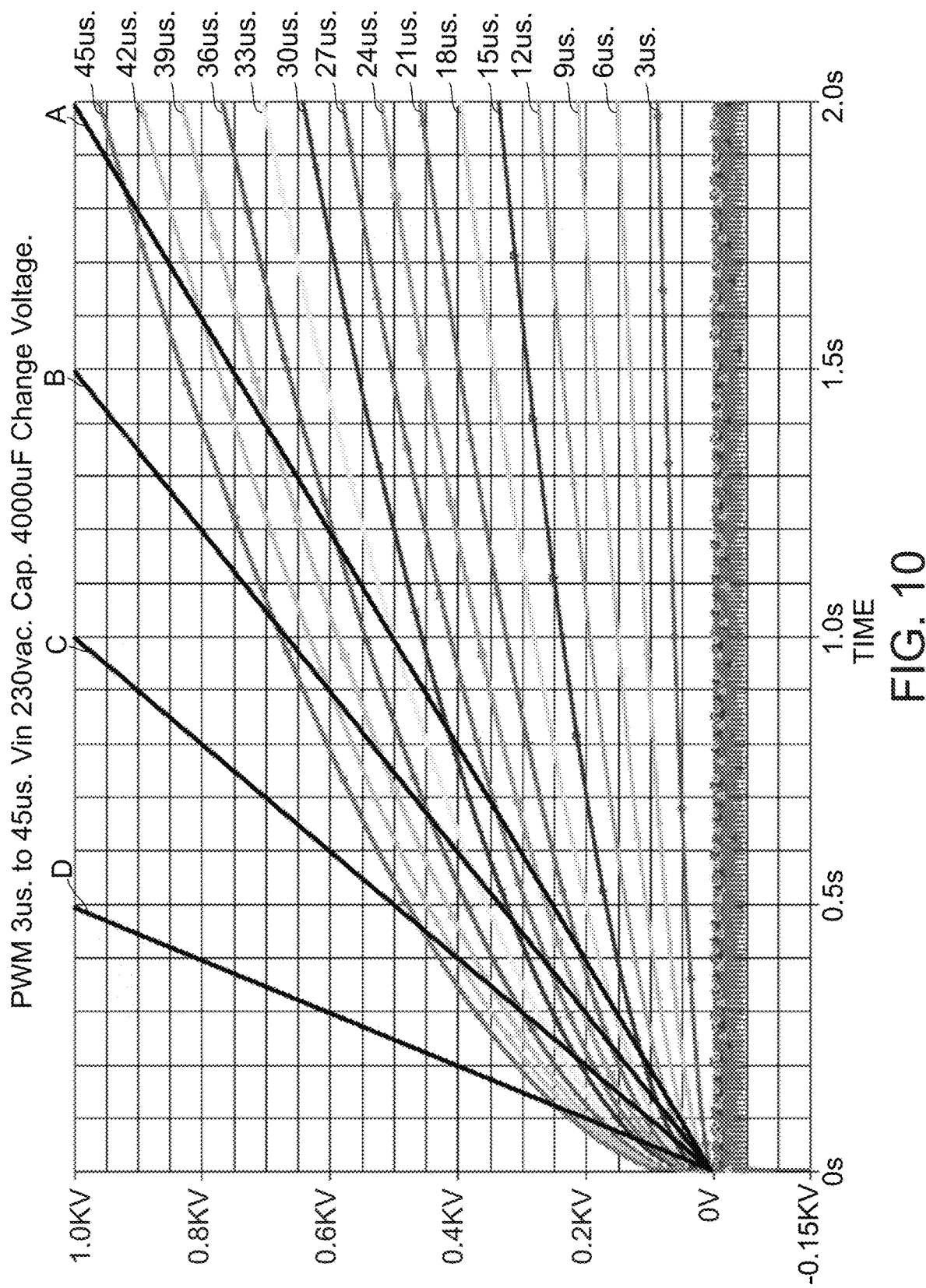
Figure 11A:
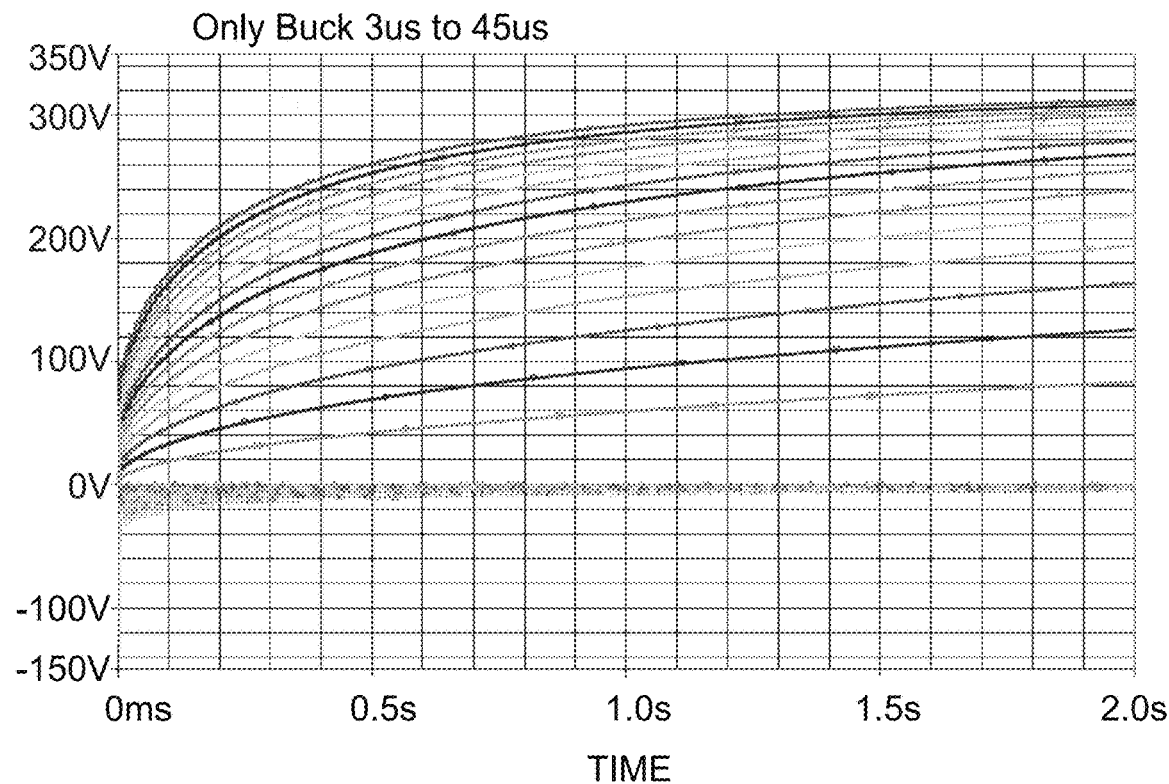
Figure 11B:
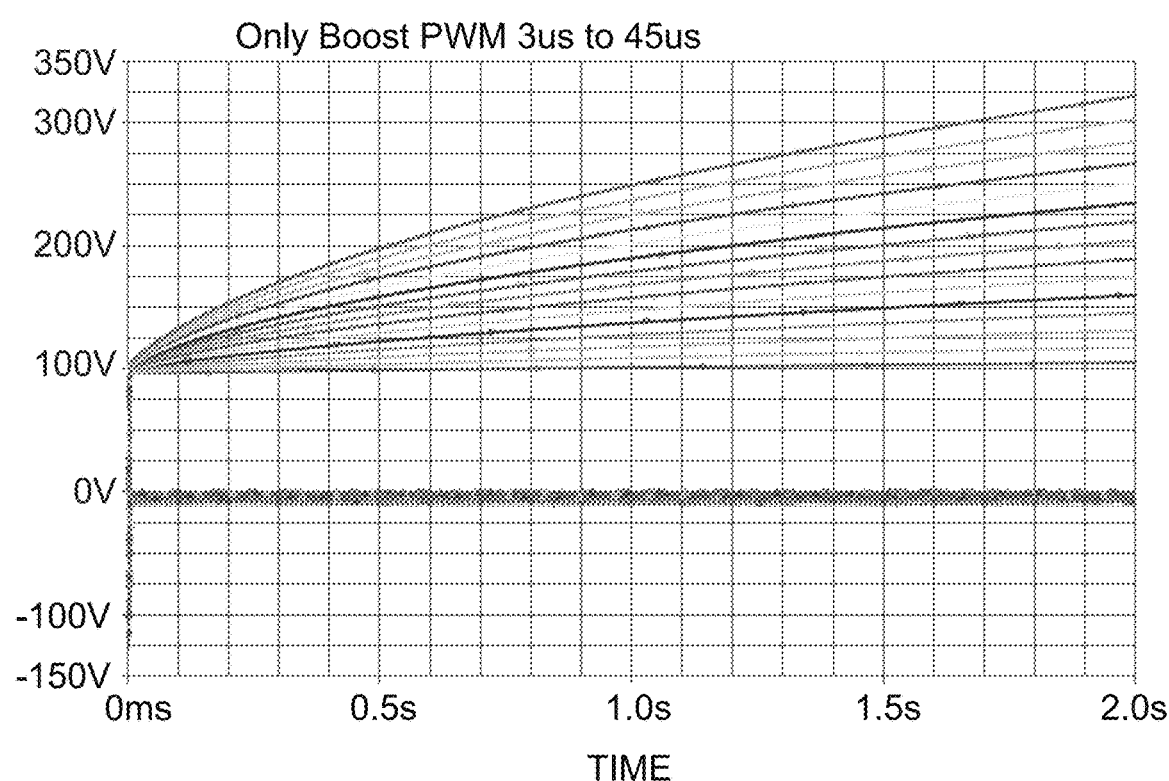

and of a fly-back power controller powered by an independent auxiliary power converter, according to some embodiments of the present invention;

FIG. 7C is a graph chart of a power up sequence of a fly-back power controller powered by an independent auxiliary power converter, according to some embodiments of the present invention;

FIG. 8A and FIG. 8B are schematic illustrations of an exemplary electric circuit of a buck-boost converter wired to connect a high rail and a low rail respectively of a power source to a capacitor unit, according to some embodiments of the present invention;

FIG. 9 is a graph depicting a plurality of voltage rising slopes of a voltage generated by a buck-boost converter operated with different PWM pulse widths, according to some embodiments of the present invention;

FIG. 10 is a graph depicting linear voltage rising slopes constructed by dynamically adjusting a PWM pulse width controlling a buck-boost converter, according to some embodiments of the present invention;

FIG. 11A is a graph depicting a plurality of voltage rising slopes of a voltage generated by a buck-boost converter operated in buck only mode with different PWM pulse widths, according to some embodiments of the present invention; and FIG. 11B is a graph depicting a plurality of voltage rising slopes of a voltage generated by a buck-boost converter operated in boost only mode with different PWM pulse widths, according to some embodiments of the present invention.

DETAILED DESCRIPTION OF EMBODIMENTS OF THE INVENTION

The present invention, in some embodiments thereof, relates to a Pulse Forming Network (PFN) and, more particularly, but not exclusively, to a PFN having multiple capacitor units and a common passive output circuit.

According to some embodiments of the present invention, there is provided a pulse forming network (PFN) set to deliver an energizing pulse having a regulated multi-level voltage waveform formed by a plurality of capacitor charge flows, to a load. The energizing pulse is optionally formed charging a set of capacitor units with different voltages and discharging them, sequentially and/or simultaneously (in parallel), via a common passive output circuit, to the load.

The PFN comprises of a plurality of modules each constructed from a capacitor unit and a switch operated to couple the respective capacitor unit to the load via the common passive output circuit which comprises a diode and an inductor (e.g. a coil). Therefore, each of the modules when coupled with the common passive output circuit forms a respective one of a plurality of buck converters which may be controlled by a control unit operating the switches to release the load of the capacitor units to the load in a sequence ordered to form patterned energized pulses having regulated or unregulated multi-level voltage or current waveform, for example, a desired square and variable level waveform having multiple levels.

Since the common passive output circuit is shared by all the PFN modules, there is no need for independent passive output circuit in each of the modules as may be typically applied by existing designs and implementations. This may significantly reduce complexity of the design and may further reduce costs of the PFN. Moreover, using fewer components may significantly increase reliability of the PFN and may increase mean time between failures (MTBF). Using fewer components may further reduce the PFN design and/or production cost.

All the components of each module are optionally adjusted to a certain working output voltage required and/or defined for the respective capacitor unit. Optionally, the plurality of capacitor units is charged by a single power source, a charger, which is adapted to its working output voltage. Optionally, the PFN comprises a plurality of power sources each adapted to charge one or more of the capacitor units. In such a manner, the capacitor unit is charged by a power source which is adapted to its working output voltage and therefore no or only a little of charging power is wasted.

Optionally, one or more of the modules and/or capacitor units are connected to a tester circuit configured to check the presence or absence of one or more defectives and/or malfunctions in the module, in real time. Optionally, one or more of the modules and/or capacitor units are detachably connected to the PFN so it may be replaced of needed by a functioning module.

According to some embodiments of the present invention, there is provided a method of generating an energizing pulse, for example using the PFN that is outlined herein above and described herein after. The method is based on charging the plurality of capacitor units with a plurality of charges and sequentially coupling the plurality of charged capacitor units to the load via the common passive output circuit so as to deliver to the load an energizing pulse having a regulated and/or upregulated multi-level voltage with a desired waveform.

The capacitor units of the PFN may be charged to high working voltages thus storing high energy which may be released in high energy patterned energized pulses suitable for a plurality of high energy applications. Such applications may include, for example, a flash lamp, such as a Xenon lamp, of an Intense Pulse Light (IPL) device, a Filament Wire lamp, pumping a laser pulse lamp and/or diode, a Driver Electric Motor in acceleration mode, an electromagnet, a Marx generator, a radar, a fusion generator, a particle accelerator, a portable Sun Simulator energized by a DC source and/or any load which is energized with a patterned energized pulse having a regulated and/or upregulated multi-level voltage.

According to some embodiments of the present invention, there is provided a charging circuit for charging the plurality of capacitor units from the power source(s) using a fly-back power circuit controlled by a fly-back power controller adapted to control conversion of a rectified alternating input current (AC) received from an alternating power source to a direct current (DC) driven to charge the capacitor units. In particular, the fly-back power controller is powered by an independent auxiliary power converter, for example, an analog converter adapted to convert the rectified alternating input current to a direct current driven to the fly-back power controller. In order to reduce and potentially prevent transients resulting from current fluctuations and avoid and/or reduce use of transient suppression devices, the direct current generated by the fly-back power circuit may be limited in typical fly-back implementations. Limiting the current may significantly prolong the build-up time for generating the voltage driven to power the fly-back power controller which is typically powered from a branch of the primary side of a transformer of the fly-back power circuit. Powering the fly-back power controller from the auxiliary power converter may therefore significantly reduce the build-up time for generating the voltage driven to power the fly-back power controller, in particular during a first power-on of the fly-back circuit and hence significantly reduce the charge time of the capacitor units or inductor unit while limiting the current driven from the fly-back circuit to avoid and/or reduce the use of the transient suppression devices. Moreover, due to the limited charge current, the input filter required for the fly-back power controller may be significantly simplified and/or cost effective while fully compliant with regulations standards and specifications.

According to some embodiments of the present invention, the charging circuit includes uninsulated buck-boost converter for charging the capacitor units. The buck-boost converter may be controlled by the control unit operating one or more Pulse width Modulation (PWM) circuits to trigger one or more switches of the buck-boost converter to charge the capacitor units to the desired working voltage levels. Moreover, the control unit may dynamically adjust the pulse width of the PWM circuit(s) to achieve an approximately linear voltage rising slope of the voltage charging the capacitor units. Charging the capacitor units with the linearly rising voltage slope may significantly reduce damage to the capacitor units and may therefore increase reliability and/or longevity of the capacitor units. Moreover, charging the capacitor units with a linearly rising voltage slope may allow using lower grade capacitors for one or more of the capacitor units thus reducing cost of the PFN.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1A:
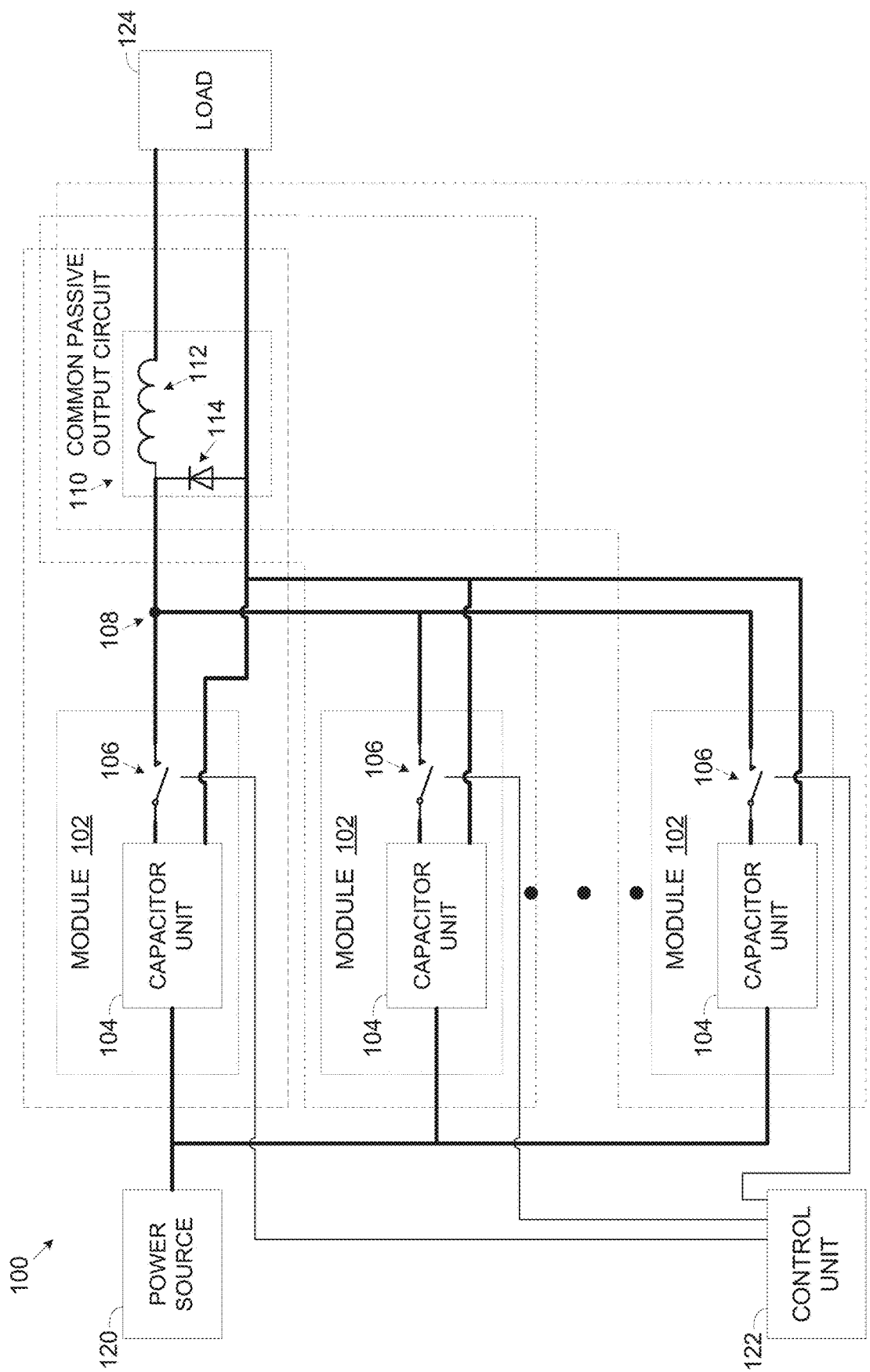
FIG. 1A is a schematic illustration of a PFN having a shared power source for charging a plurality of modules each comprising a capacitor unit and a switch circuit where all the modules are connected to a load via a common passive output circuit, according to some embodiments of the present invention.

Reference is now made to FIG. 1A, which is a schematic illustration of a PFN having a shared power source for charging a plurality of modules each comprising a capacitor unit and a switch circuit where all the modules are connected to a load via a common passive output circuit, according to some embodiments of the present invention. An exemplary PFN 100 may comprise a plurality of modules 102, each having a capacitor unit 104 wired to be connected to a load 124 via a switch 106 and a common passive output circuit 110 comprises an inductor 112 (e.g. coil) and a diode 114, specifically an anti-reversing diode. A control unit 122 may operate the switches 106 to electrically couple respective capacitor units 104 to the load 124 via the common passive output circuit 110.

The capacitors units 104 are charged from one or more isolated power sources 120, specifically, the capacitors units 104 of the PFN 100 depicted in FIG. 1A are charged by a single shared power source 120 configured to charge a number of capacitor units 104. The isolated power source(s) 120 used to charge the capacitor units 104 are optionally high voltage power sources, for example chargers which are connected to a power line and/or to a set of batteries optionally powered by one or more power sources. The power source(s) 120 are adapted to energize the capacitors units 104 according to working output voltages the capacitor units 104 are required to drive to the load 124.

Each of the modules 102 may be regarded as a partial buck DC/DC converter which when coupled with the common passive output circuit 110 forms a buck regulator as known in the art. This is on contrast to typical existing implementations in which each branch of the PFN may consist a complete buck converter comprising both a module such as the module 102 and a dedicated passive output circuit such as the common passive output circuit 110. As seen in FIG. 1A, each of the dashed/dotted lines ( — —, — · —, — ·· — ) comprises a different one of the modules 102 and the common passive output circuit 110 thus constituting a respective one of a plurality of buck converters. The discharge level of the capacitor units 104 is correlated with the voltage regulation level of the respective buck converter. For example, the buck converter formed from one of the modules 102 coupled with the common passive output circuit 110 may bring the discharged energy to a voltage level driven to the load 124 that is about 90% of the minimum input discharged voltage level.

Optionally, the capacitor units 104 have different working output voltages. In such a manner, the PFN 100 may energize the load 124 by producing and delivering a plurality of sequential regulated and/or unregulated charges that form a patterned energizing pulse having a regulated multi-level voltage waveform. As used herein, energizing means supplying with electrical power. The PFN 100 may be used by charging the capacitor units 104 with energy which is ten times or even more of the input charge. In use, the capacitor units 104 of the PFN 100 accumulate electrical energy over a comparatively long time and then sequentially release the accumulated electrical energy, under the control of the control unit 122, in the form of a relatively square pulse of comparatively short duration.

As such, the multi-level voltage waveform may have various shapes, such as a square waveform, a Gaussian waveform and/or a thin integrated circuit or any other non-sinusoidal waveform, such as, for example, rectangular waveforms, ramp waveforms, triangle waveforms, spiked waveforms, saw-tooth waveforms and/or the like.

According to other embodiments of the present invention the capacitor units 104 have a common output voltage level. In such a manner, the PFN 100 may energize the load 124 with a pulse having a substantially uniform voltage.

Optionally, the current of the discharged energy is higher than the feed current driven to load the capacitor units 104. An exemplary load 124 may be a high power microwave oscillator, such as a klystron or magnetron, a flash lamp, such as a Xenon lamp, or Filament Wire lamp, pumping laser pulse, a Driver Electric Motor in acceleration moment, an electric car load, such as a motor, a laser diode, an electromagnet, a Marx generator, a pulsed laser source, such as CO2 TEA laser source, a radar, a fusion generator (currently in research), a particle accelerator, Sun Simulator, a portable Sun Simulator which is energized by a DC source, Dimming Ballast driver for a High Intensity Discharge (HID) CW lamp, and/or any load which is energized with a patterned energizing pulse having a regulated multi-level voltage (having two or more voltage DC or AC polarity levels).

Optionally, the switches 106 may be operated by the control unit 122 to simultaneously connect some or all of the capacitor units 104 to the load 124. In such a manner, the output of the modules 102 may be combined to form a discharge with a higher current than the current of each one of them. The switches 106 connect the modules 102 in parallel so that the output thereof is an accumulation of high currents. It should be noted that since the output of each module 102 is regulated, the summed output is also regulated.

Additionally or alternatively, the switches 106 may be operated by the control unit 122 to sum the outputs of the capacitor units 104 of multiple and optionally all of the modules 102 to increase the voltage of the discharge before energizing the load 124. For example, the output of the modules 102 may be connected in parallel to increasing the overall capacitance of the PFN 100 and/or the PFN 200. In another example, the output of the modules 102 may be connected in series to increase an overall output voltage. In both situations, the energy released to the load 124 may be increased to form a discharge with a higher voltage than the voltage of each one of the modules 102 separately. The control unit 122 may operate the switches 106 to connect the output of the modules 102 in a row, in series, one after the other and/or in parallel so that the output thereof is an accumulation of voltages thus producing a high voltage applied to the load 124. As stated before, since the output of each module 102 is regulated, the summed output is also regulated.

Figure 1B:
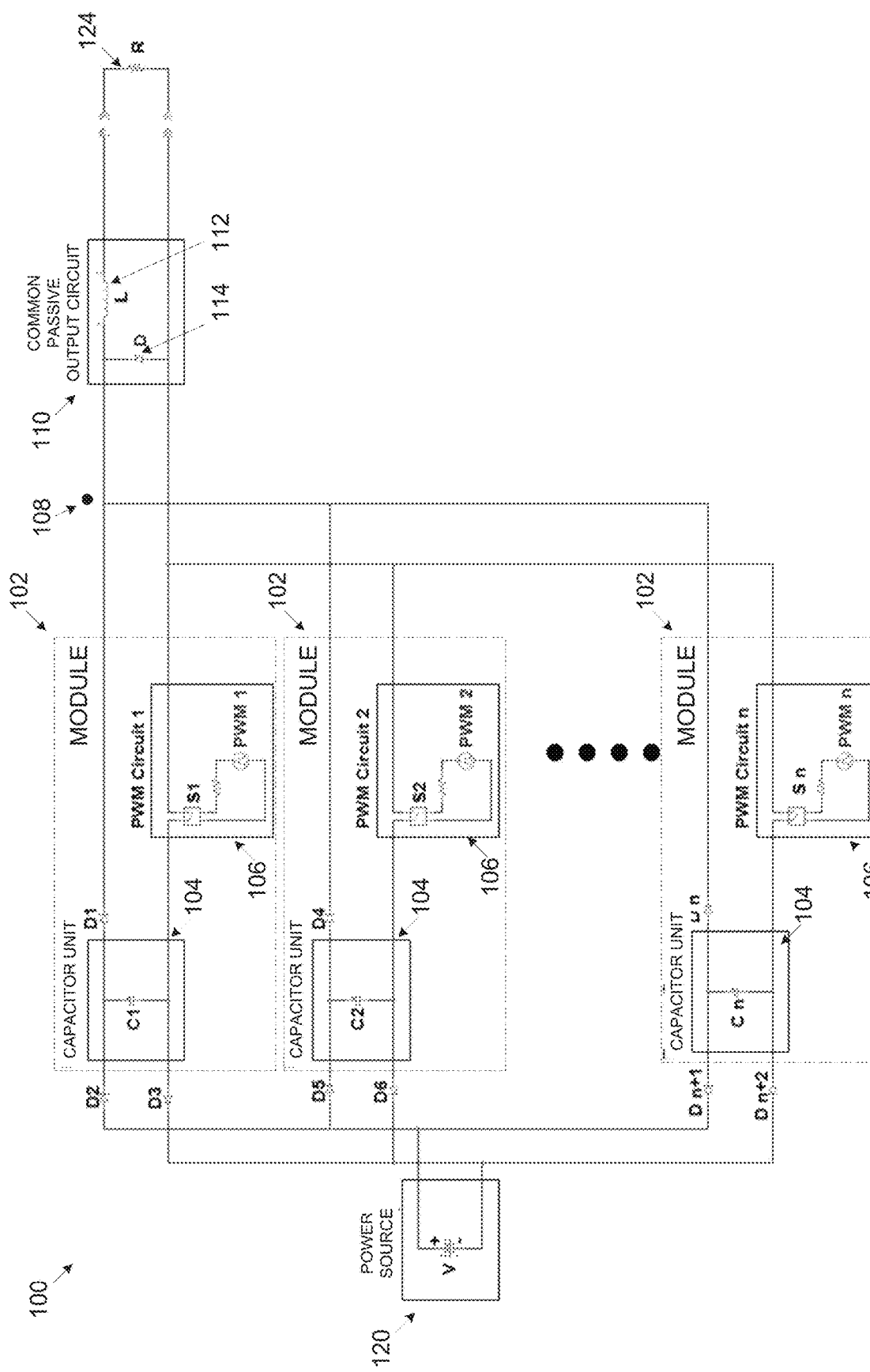
FIG. 1B is a schematic illustration of an exemplary electric circuit which is wired to form a PFN as depicted in FIG. 1A, according to some embodiments of the present invention.

An exemplary electric circuit that is wired to form the PFN 100 depicted in FIG. 1A, according to some embodiments of the present invention, is depicted in FIG. 1B. The control unit 122 may operate one or more Pulse Width Modulation (PWM) units and/or circuits connected to each of the switches 106 to set the respective switch 106 in SHORT (ON) state thus connecting the respective module 102 to the common passive output circuit 110 (and hence from the load 124) or in OPEN (OFF) state thus disconnecting the respective module 102 from the common passive output circuit 110. While it is possible that a single PWM may be allocated to control multiple switches 106, typically each switch 106 is controlled by a dedicated PWM circuit.

The control unit 122 may control the PWM circuits to operate the switches 106 thus operating each of the buck converters to generate a DC voltage according to the desired working voltage required by the respective buck converter.

Optionally, a diode such as, for example, an anti-reversing diode, is connected between the output of each module 102 and the passive output circuit 110, specifically between the output of capacitor unit 104 of each module 102 and a connection point 108, connecting the plurality of modules 102 to the common passive output circuit 110. For example, diodes D1, D4 through Dn may be connected between the outputs of the capacitor units 104 of the respective modules 102. The diode is provided to keep each of the capacitor units 104 from becoming a load when one or more other modules 102 power the load 124 with a different charge. Moreover, the anti-reversing diode placed between the output of each capacitor unit 104 and the connection point 108 may significantly suppress and attenuate transient pulses in the generated energized pulse driven to the load 124.

Optionally, each capacitor unit 104 is connected to a local indicator or test circuit, which is set to indicate whether the respective capacitor unit 104 functions properly or not. Optionally, the indicator circuit comprises a Light Emitting Diode (LED) that is active when the capacitor operates properly.

Each of the buck converters formed by a respective module 102 and the common passive output circuit 110 maintains a constant regulated voltage level and/or current as known in the art. The regulated voltage may be set automatically or selected by the control unit 122 operating the switches 106 accordingly as described herein after. Depending on the design, the buck converters may be used to regulate one or more direct current (DC) voltages and/or currents from the capacitor units 104. As the buck converters maintain a constant voltage level and/or current, the output of each one of the modules 102, as received by the load 124, can be evaluated in advance.

According to some embodiments of the present invention, the PFN 100 is set to continually generate an energizing pulse having a regulated multi-level voltage.

Figure 1C:
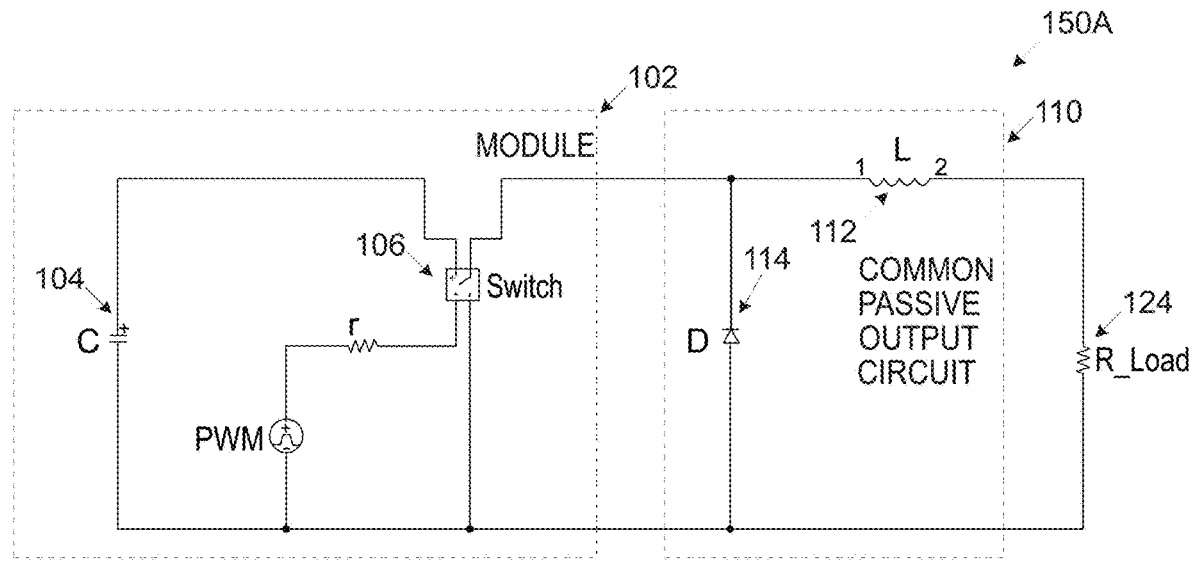
FIG. 1C is a schematic illustration of an exemplary electric circuit which is wired to form a single module of a PFN as depicted in FIG. 1A in which a high rail of a capacitor unit is connected to a common passive output circuit through a high side switch, according to some embodiments of the present invention.
Figure 1C:
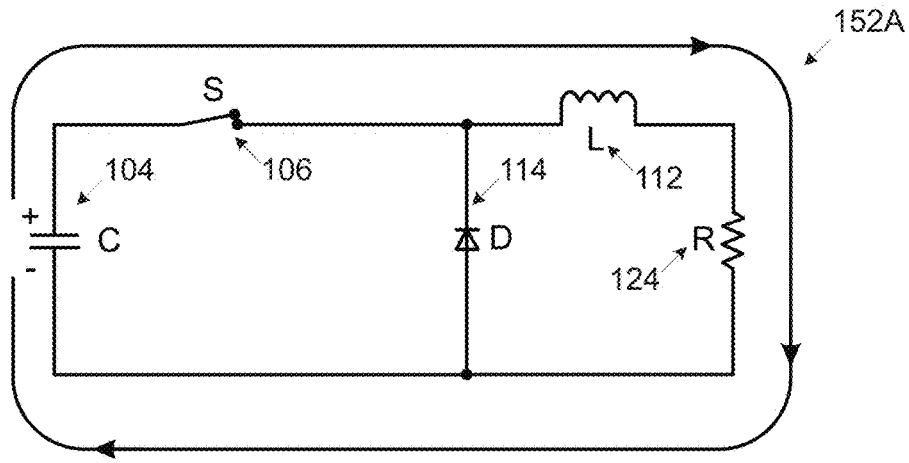
Figure 1C:
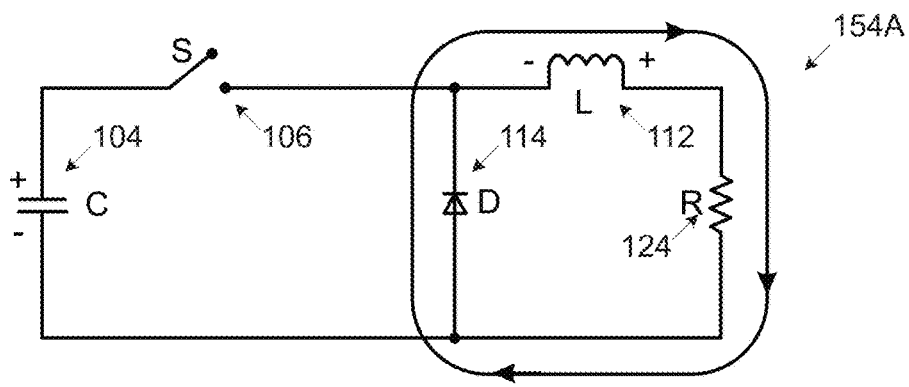

According to some embodiments, the switches 106 may be wired to connect a high (voltage) rail of the capacitor units 104 (i.e. the positive pole of the capacitor units 104) to the common passive output circuit 110 as shown in FIG. 1C. An exemplary circuit 150A depicting a single buck converter utilizing a single module 102 connected to the common passive output circuit 110 may include a switch 106 which electronically couples the high side of the capacitor units 104 to the common passive output circuit 110 according to the PWM circuit. The high side is typically the positive pole (contact, electrode) of the capacitor unit 104 and the switch 106 therefore controls the current supply path. The PWM is controlled by the control unit 122 to produce the working voltage required by the buck converter. As shown at 152A when the switch 106 is in the SHORT state, the current flows from the capacitor unit 104 via the inductor 112 of the common passive output circuit 110 to the load 124. However, when the switch 106 is in the OPEN state as shown at 154A, the current flows via the diode 114 and the inductor 112 of the common passive output circuit 110 to the load 124. By controlling the switch 106 to rapidly switch from the SHORT state to the OPEN state and vice versa, the voltage driven by the buck converter to the load 124 may be set to the desired working voltage as known in the art.

Figure 1D:
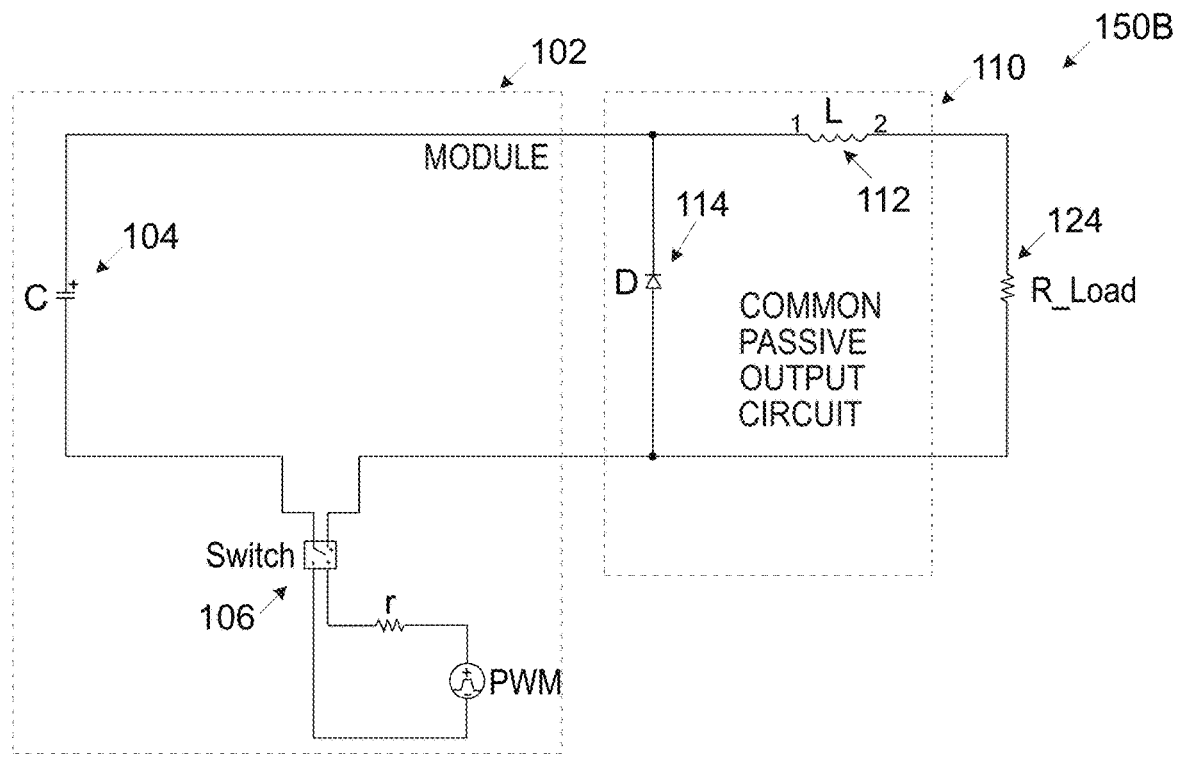
FIG. 1D is a schematic illustration of an exemplary electric circuit which is wired to form a single module of a PFN as depicted in FIG. 1A in which a low rail of a capacitor unit is connected to a common passive output circuit through a low side switch, according to some embodiments of the present invention.
Figure 1D:
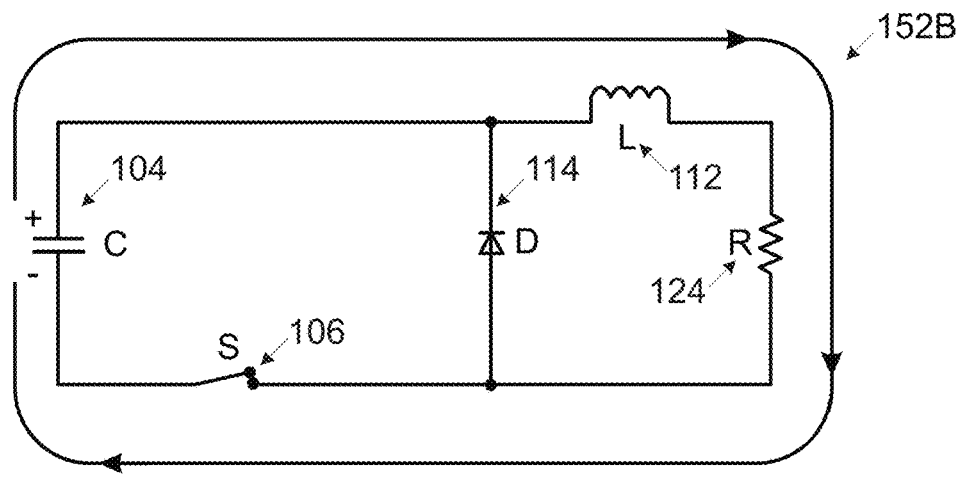
Figure 1D:
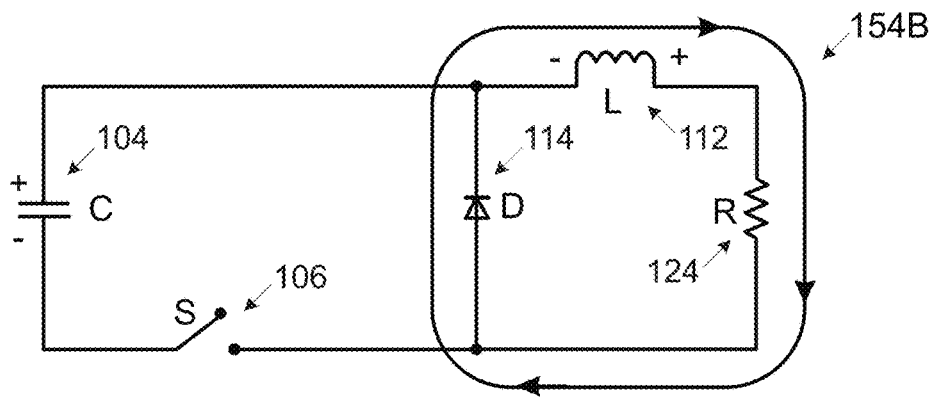

According to some embodiments, the switches 106 may be wired to connect a low (voltage) rail of the capacitor units 104 (i.e. the negative pole of the capacitor units 104) to the common passive output circuit 110 as shown in FIG. 1D. An exemplary circuit 150B depicting a single buck converter utilizing a single module 102 connected to the common passive output circuit 110 may include a switch 106 which electronically couples the low rail of the capacitor units 104 to the common passive output circuit 110 according to the PWM circuit. The low rail is typically the negative pole (contact, electrode) of the capacitor unit 104 and the switch 106 therefore controls the current return path. The PWM is controlled by the control unit 122 to produce the working voltage required by the buck converter. As shown at 152B when the switch 106 is in the SHORT state, the current flows from the capacitor unit 104 via the inductor 112 of the common passive output circuit 110 to the load 124. However, when the switch 106 is in the OPEN state as shown at 154B, the current flows via the diode 114 and the inductor 112 of the common passive output circuit 110 to the load 124. By controlling the switch 106 to rapidly switch from the SHORT state to the OPEN state and vice versa, the voltage driven by the buck converter to the load 124 may be set to the desired working voltage as known in the art.

Figure 2A:
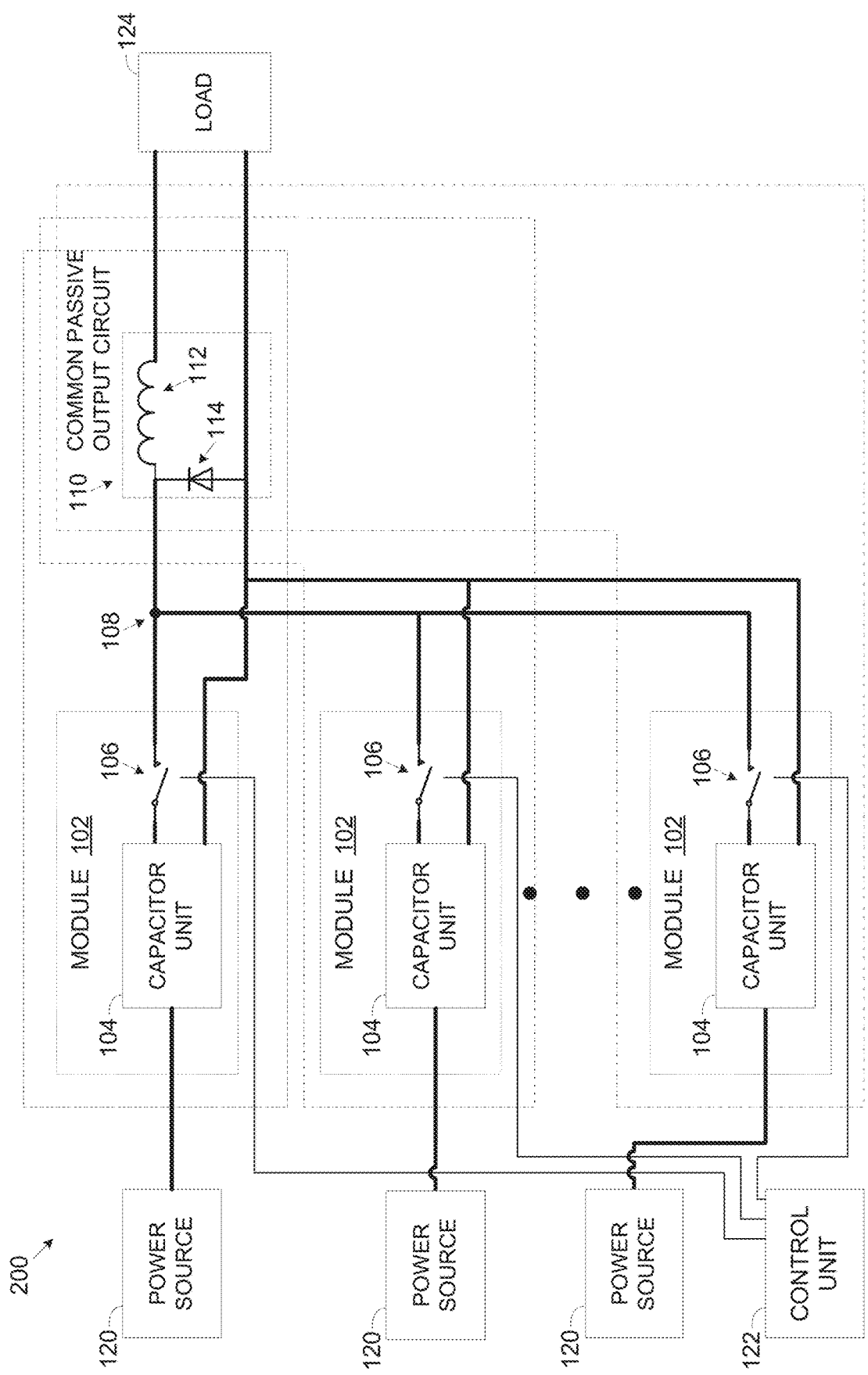
FIG. 2A is a schematic illustration of a PFN having a dedicated power source for charging each of a plurality of modules each comprising a capacitor unit and a switch circuit where all the modules are connected to a load via a common passive output circuit, according to some embodiments of the present invention.

Reference is now made to FIG. 2A, which is a schematic illustration of a PFN 200 similar to the PFN 100 with the exception that the PFN 200 comprises a plurality of power sources such as the power source 120 each dedicated for charging a respective one of a plurality of modules such as the module 102 comprising a capacitor unit such as the capacitor unit 104 and a switch circuit such as the switch 106. where all the modules 102 are connected to a load such as the load 124 via a common passive output circuit such as the common passive output circuit 110, according to some embodiments of the present invention.

Similarly to the PFN 100, each of the modules 102 may be regarded as a partial buck DC/DC converter which coupled with the common passive output circuit 110 forms a buck regulator as known in the art. As seen in FIG. 2A, each of the dotted lines (--, -.-, -..-), comprises a different one of the modules 102 which together with the common passive output circuit 110 constitutes a respective one of a plurality of buck converters. The discharge level of the capacitor units 102 is correlated with the voltage regulation level of the respective buck converter.

Each of the power sources 120 of the PFN 200 is separately connected to one of the capacitor units 104 or optionally to a group of capacitor units 104 having a common working output voltage level. In such a manner, while one or more capacitor units 104 are charged by one power source 120 one or more other capacitor units 104 may be charged by another power source 120. In such embodiments, each power source 120 is adapted to the working output voltage level required from the fed capacitor unit(s) 104. As the voltage level of the power source 120 and the capacitor unit 104 are adapted to the output load 124, less energy may be wasted during the charging of the capacitor units 104. As stated, the power source(s) 120 may be high power sources, for example chargers which are connected to the power line and/or to the set of batteries optionally powered by a power source.

Figure 2B:
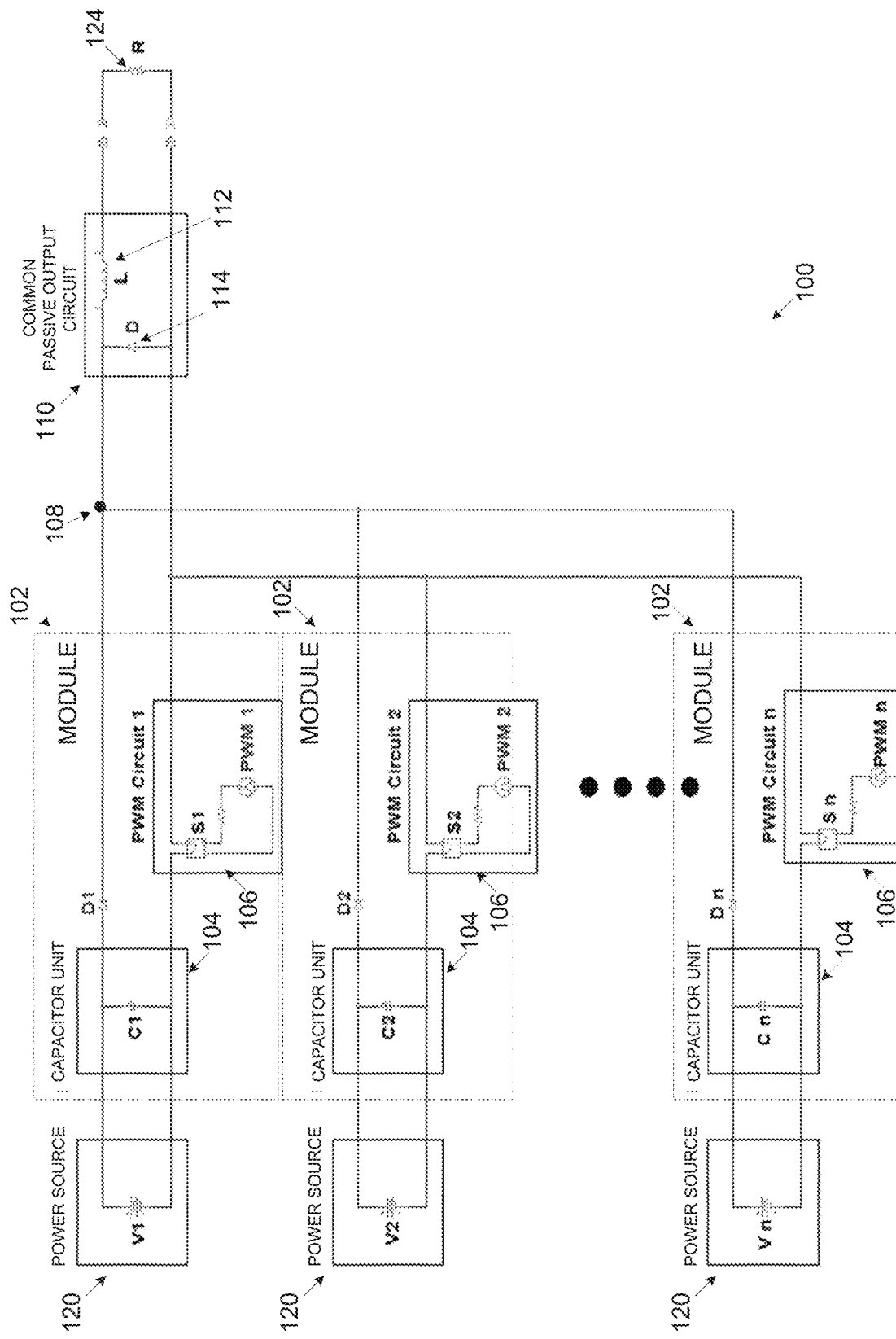
FIG. 2B is a schematic illustration of an exemplary electric circuit which is wired to form a PFN as depicted in FIG. 2A, according to some embodiments of the present invention.

An exemplary electric circuit that is wired to form the PFN 200 depicted in FIG. 2A, according to some embodiments of the present invention, is depicted in FIG. 2B. As described for the PFN 100, the control unit 122 may operate one or more PWM units and/or circuits connected to each of the switches 106 to set the respective switch 106 in SHORT state or in OPEN state to connect/disconnect the respective module 102 from the common passive output circuit 110. Similarly to the PFN, 100, it is possible that a single PWM may be allocated to control multiple switches 106, however typically each switch 106 is controlled by a dedicated PWM circuit.

According to some embodiments of the present invention, the control unit 122 is wired to control and/or to monitor the modules 102. As used herein, wired means connected in any manner that allows establishing communication between control unit 122 and the modules 102. The control unit 122, which optionally includes a microcontroller, is optionally wired to control, for example to open and to close, each one of the switches 106. For example, the control unit 122 determines the timing and/or the length of the period in which each switch 106 is in the SHORT state or in the OPEN state. For example, the control unit 122 may control the PWM circuits according to the determined timing to operate the switches 106 accordingly. In such a manner, the control unit 122 controls the sequence and/or number of capacitor units 104 which are connected to power the load 124 in series or parallel. For example, the number of switches 106 may be changed according to the required voltage and power level required to be driven to the load 124.

Optionally, the control unit 122 controls the switches 106 to connect the capacitor units 104 sequentially and non-sequentially so as to form an energized pulse having a uniform voltage waveform or a waveform having multi-level voltages. Optionally, the control unit 122 controls the switches 106 to connect and/or disconnect a number of capacitor units 104 simultaneously. In such a manner, the summed charges of the simultaneously connected capacitor units 104 are propagated to the load 124 and the current of the charge which energizes the load 124 may be significantly increased. Optionally, the control unit 122 controls the switches 106 so that the number of capacitor units 104, which are connected to discharge to the load 124 at any given time, varies in a different point in time. In such a manner, the energized pulse driven to the load 124 has a regulated multi-level voltage pattern.

Optionally, the control unit 122 controls the charges which are charged in each of the connected capacitor units 104, for example by instructing the power source(s) 120 to charge the capacitor units 104 with a charge having a certain voltage.

Figure 3A:
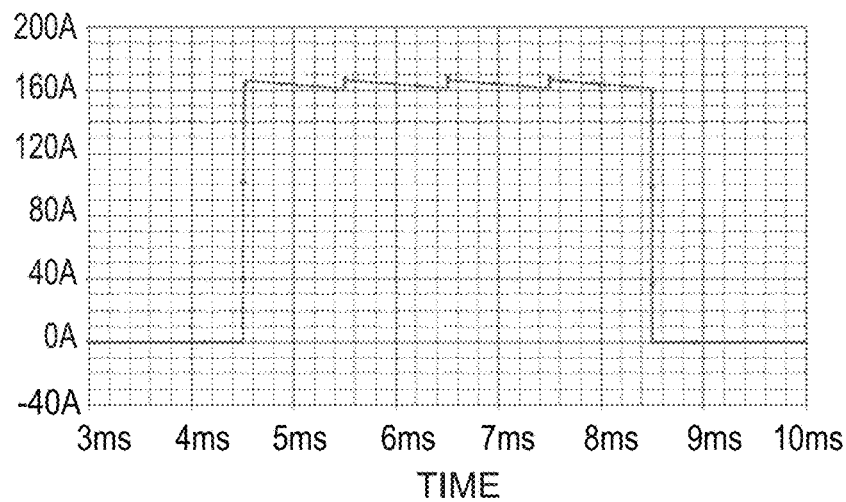
FIG. 3A, FIG. 3B and FIG. 3C are graphs depicting a simulation of exemplary square waveforms which are generated using a PFN constructed as depicted in FIG. 1A and/or FIG. 2A, according to some embodiments of the present invention.
Figure 3B:
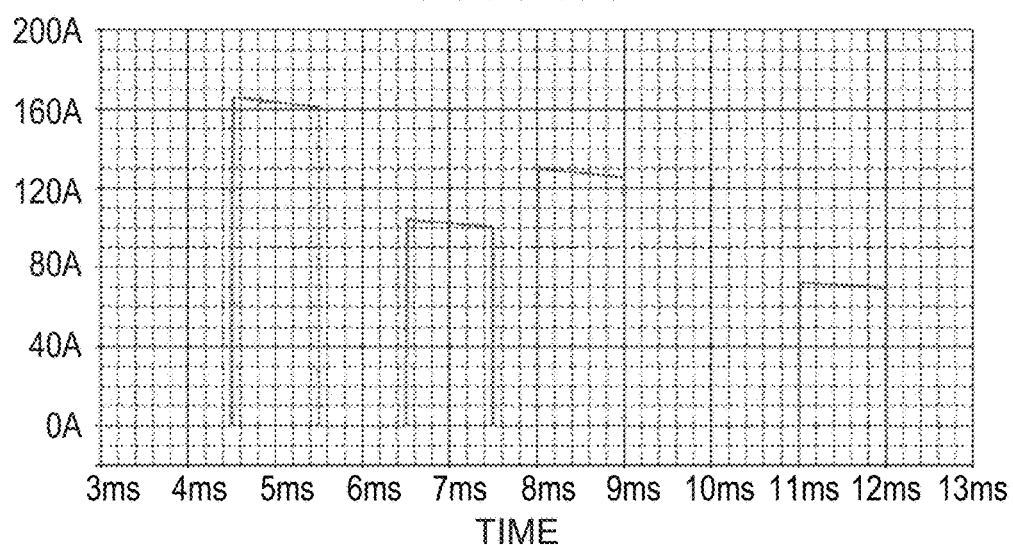
Figure 3C:
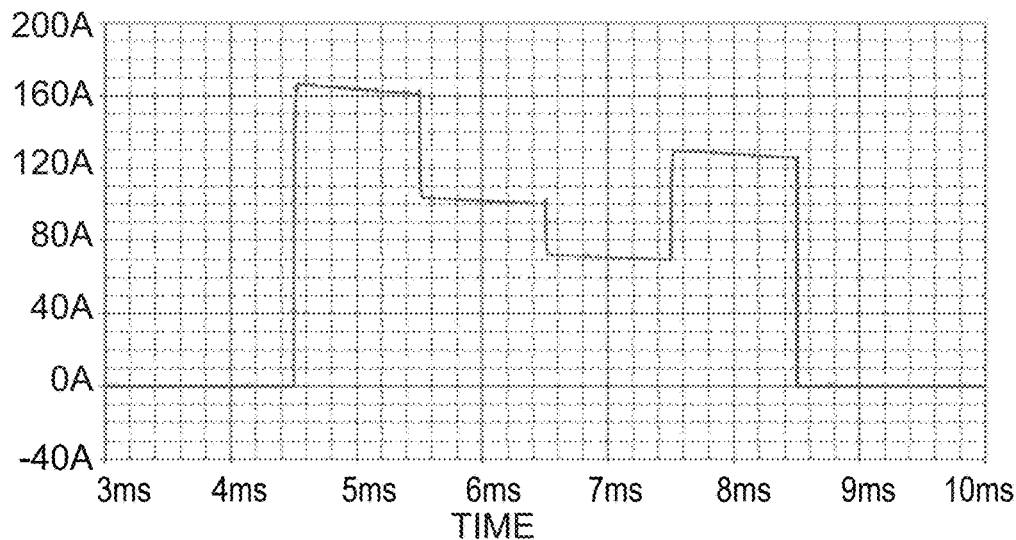

Reference is now made to FIG. 3A, FIG. 3B and FIG. 3C which are graphs depicting a simulation of exemplary square waveforms generated using a PFN such as the PFN 100 and/or the PFN 200, according to some embodiments of the present invention. A control unit such as the control unit 122 may operate the switches 106 to control the discharges of capacitor units such as the capacitor units 104 in order to generate energized pulses having a desired pattern of regulated multi-level voltages to be driven via a common passive output circuit such as the common passive output circuit 110 to a load such as the load 124. For example, a control unit such as the control unit 122 may operate the switches 106 to alternately connect multiple capacitor units 104 to the load 124 in order to generate an energized pulse having a square waveform comprising sequential high picks as depicted in FIG. 3A. In another, example, by appropriately controlling the control unit 122 may operate the switches 106 to simultaneously connect one or more of the capacitor units 104 to the load 124 and optionally disconnect all the capacitor units 104 in order to generate an energized pulse having a square waveform comprising short and high picks as depicted in FIG. 3B and FIG. 3C.

Optionally, the control unit 122 is connected to the load 124 so as to measure changes in impedance of the load 124. In such a manner, the control unit 122 may adapt the operation of the modules 102, specifically the operation of the buck converters utilized by the modules 102 according to the changes of the impedance.

Optionally, the control unit 122 controls the switches 106 and/or the power source(s) 120 to deliver an energizing pulse having a multi-level voltage waveform according to the charge level of one or more of the capacitor units 104. For example, the control unit 122 may compare (match) between the charging voltage level provided by a certain power source 120 to the potential voltage level of a respective charged capacitor unit 104. Controlling the charging according to the charge level may allow avoiding redundant charging and may therefore reduce energy loss.

Optionally, the control unit 122 adjusts one or more parameters of the PFN 100 and or the PFN 200, for example, adjustment of the discharge sequence in which it operates the switches 106 to SHORT/OPEN state, adjustment the number of switches 106 simultaneously in SHORT state, adjustment of the voltage level that is charged into the capacitor units 104 and/or the like. optionally, the control unit 122 adjusts one or more of these parameters according to instructions received from a central computing unit (CPU) such as, for example, a desktop computer, a laptop, a tablet, and/or Smartphone, optionally to separately control circuits in every module, for example from a control application which is installed thereon. It should be noted that the control unit 122 may comprise a number of separate control units.

Controlling and/or adjusting the PFN parameters may be done according to a feedback from the load 124. For example, the CPU may receive the feedback from the load 124 and may instruct the control unit 122 to adjust one or more of the PFN parameters accordingly. Optionally, multiple control units such as the control unit 122 are installed in PFN 100 and/or in the PFN 200. A dedicated control unit 122 installed in each of multiple and optionally all of the modules 102 may monitor the charges which are released from the respective capacitor unit 104.

The control unit 122 may comprise one or more microprocessors, microcontroller and/or the like.

According to some embodiments of the present invention, the PFN may be adapted to energize the load with an alternating current pulse by connecting, alternatingly, different modules 102 to the load via common passive output circuits having inverted polarity. Such alternating energized pulses may be generated to drive, for example, an electrical filament of an incandescent lamp and/or the like.

Figure 4A:
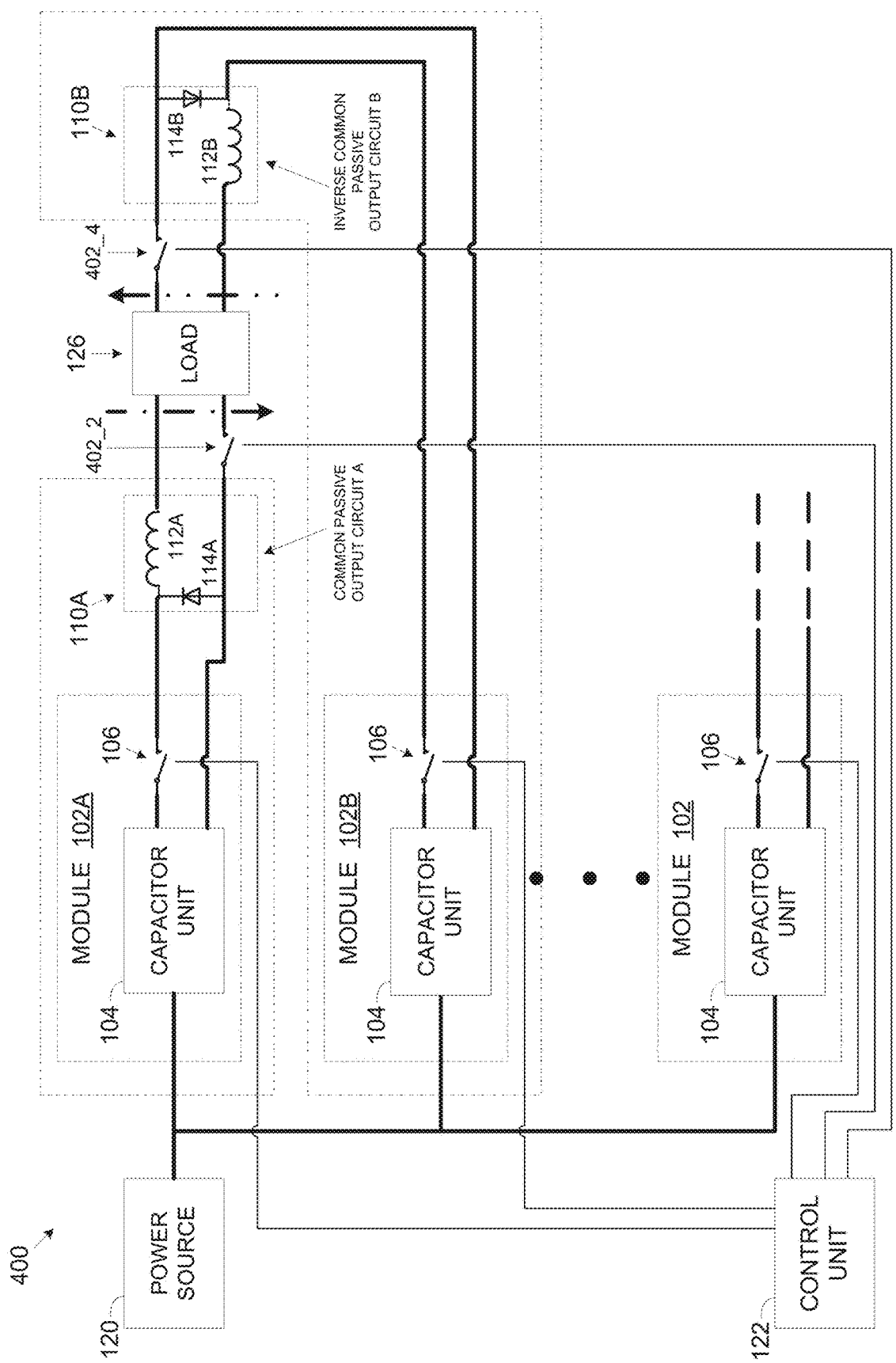
FIG. 4A is a schematic illustration of a PFN comprising a plurality of modules each comprising a capacitor unit and a switch circuit connected to an alternating current load driven via two common passive output circuits, according to some embodiments of the present invention.

Reference is now made to FIG. 4A, which is a schematic illustration of a PFN 400 comprising a plurality of modules such as the modules 102 each comprising a capacitor unit such as the capacitor unit 104 and a switch circuit such as the switch circuit 106 connected to an alternating current load 126 driven via two common passive output circuits such as the common passive output circuit 110, according to some embodiments of the present invention. The alternating current (AC) load 126, for example, an AC engine, an AC pump and/or the like requires an alternating current for its operation.

Figure 4B:
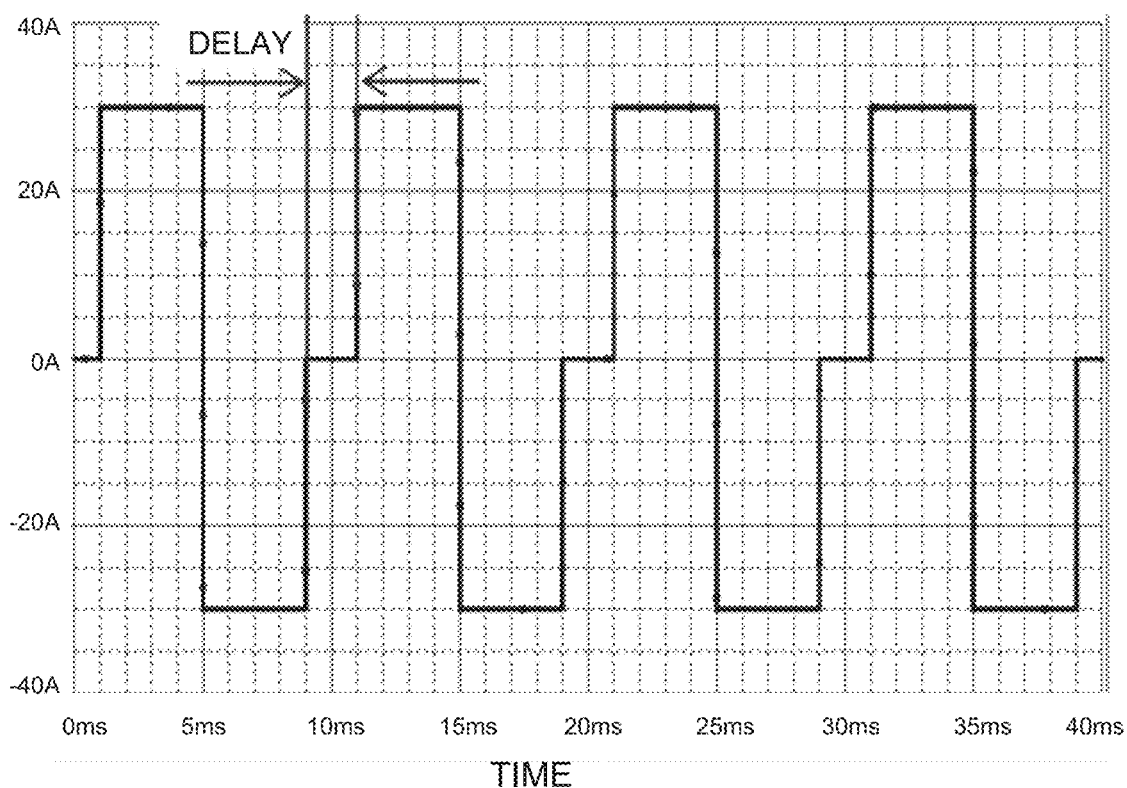
FIG. 4B is a graph depicting a simulation of an exemplary alternating square waveform generated using a PFN constructed as depicted in FIG. 4A, according to some embodiments of the present invention.

Reference is also made to FIG. 4B, which is a graph depicting a simulation of an exemplary alternating square waveform generated using a PFN such as the PFN 400 constructed as depicted in FIG. 4A, according to some embodiments of the present invention. As described for the PFN 100 and/or the PFN 200, a first module 102A coupled with a first common passive output circuit 110A constitutes a first buck converter marked with — · — dashed line which drives a first regulated energized current pulse (marked with a dashed — · — arrow) to the load 126. Similarly, a second module 102B coupled with a second inverse common passive output circuit 110B constitutes a second buck converter marked with — ·· — dashed line which drives a second regulated energized current pulse (marked with a dashed — ·· — arrow) to the load 126.

The first module 102A and the second module 102B may be connected to the load 126 via respective switches 402_2 and 404_4 which may be alternately operated by a control unit such as the control unit 122 to generate an alternating current regulated energized pulse combining the first regulated energized current pulse and the second regulated energized current pulse. This allows charging the load 126 with an energizing pulse having a regulated multi-level voltage with a desired waveform with positive and negative amplitudes. Moreover, in order to prevent current from going into the second module 102B when the first module 102A is operated to generate the positive voltage amplitudes and the switch 402_2 is in the SHORT state, the control unit 122 may set the switch 106 of the second module 102B to the OPEN state. Similarly, in order to prevent current from going into the first module 102A when the second module 102B is operated to generate the negative voltage amplitudes and the switches 402_4 is in the SHORT state, the control unit 122 may set the switch 106 of the first module 102A to the OPEN state.

For example, the PFN 400 may be used to generate an energized pulse having a pattern of positive and negative alternating voltages as depicted in FIG. 4B for driving, for example, an HID lamp. In such case, the switches 402_2 and 402_4 may be operated alternately such that assuming a 50 Hz cycle with 20 ms periods the switch 402_2 may be set in the SHORT state for a first half of the cycle (10 ms) while the switch 402_4 is set to the OPEN state. As such, during the first half of the cycle the current direction will follow the — · — dashed arrow. During the second half the cycle (10 ms) the switch 402_2 may be set in the OPEN state while the switch 402_4 is set to the SHORT state. As such, during the second half of the cycle the current direction will follow the — ·· — dashed arrow.

However, since the plasma arc of the HID lamp may be substantially maintained for short time periods while no current is driven to the HID lamp, the controller 122 may operate the switches 402_2 and 402_4 such that there is a short delay time between setting one of the switches 402 in the OPEN state to the time of setting the other switch 402 in the SHORT state. This may be done to set both switches in the OPEN state prior to activating one of the switches 402 to the SHORT state to prevent a situation in which both switches 402_2 and 402_4 are in SHORT state thus concurrently driving the opposite currents to the load 126, specifically the HID lamp load 126. When the delay is set between the connection of the first module 102A and the second module 102B, the root mean squared (RMS) in the load 126 is reduced and so the consumed power is also reduced. During the delay period, the decrease of the plasma in the HID lamp is relatively slow. This allows a delay of up to about 50% in a frequency of about 100 KHz. The minimum delay which may designated as "Dead Time" in the art is a few micro-seconds long may be inserted to further ensure that the module 102A and the module 102B do not simultaneously connect to the load 126 at the same time.

Moreover, multiple modules 102 may be operated sequentially and/or simultaneously (in parallel) to generate the first regulated energized current pulse and/or the second regulated energized current pulse combing the output the multitude of modules 102. This may be of particular benefit, for example, in case the alternating current regulated energized pulse requires a high current level exceeding the capacity of each of the modules 102 separately. In another example, combing the regulated energized current pulse of several modules 102 may be of major advantage in case the alternating current regulated energized pulse driven to the load 126 comprises a sequence of optionally different voltage levels.

Figure 5:
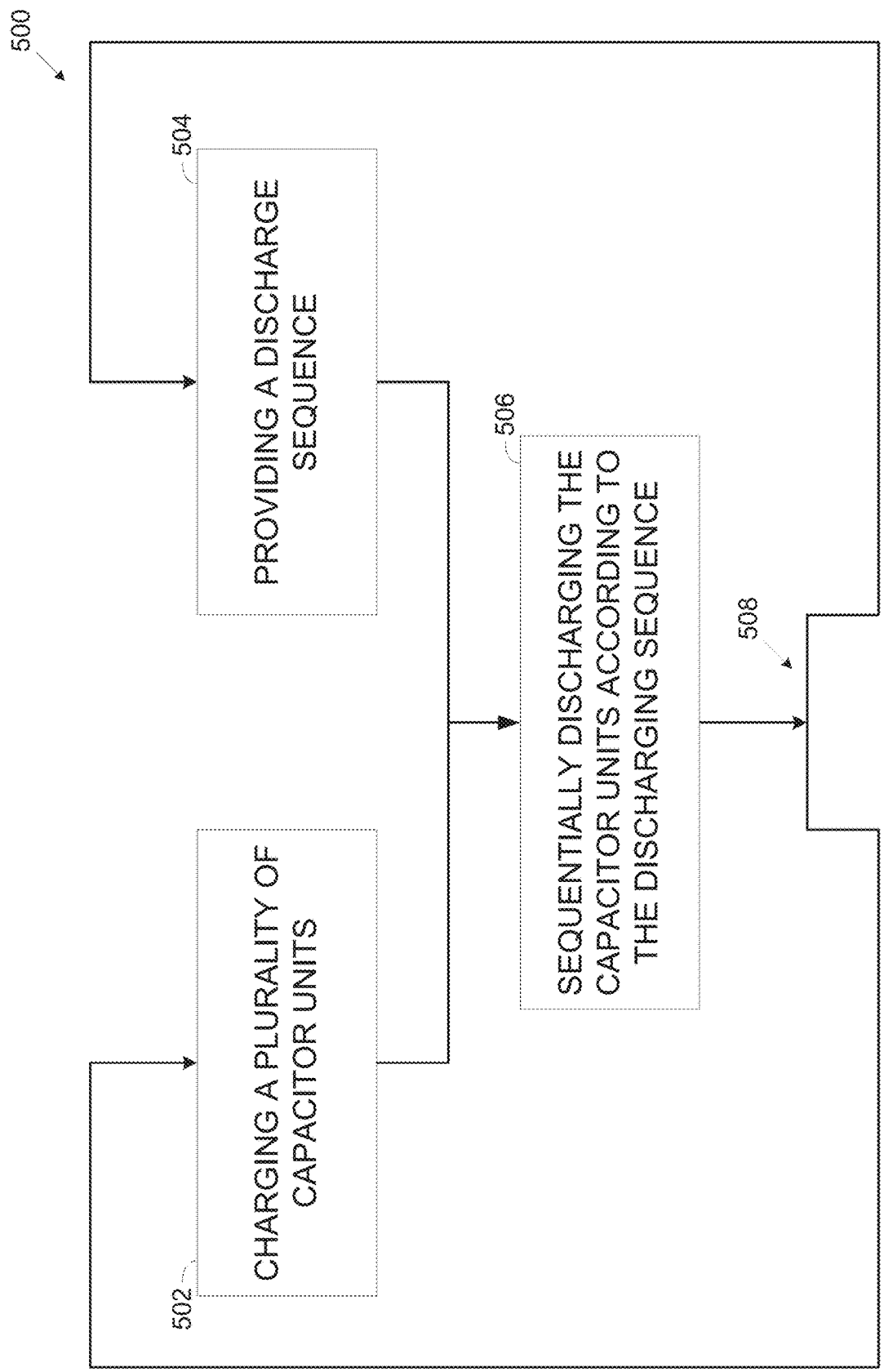
FIG. 5 is a flowchart of a process of generating a patterned energized pulse from a plurality of charges having increased voltage, according to some embodiments of the present invention.

Reference is now made to FIG. 5, which is a flowchart of a process of generating a patterned energized pulse from a plurality of charges having increased voltage, according to some embodiments of the present invention. An exemplary process 500 may be executed using a PFN such as the PFN 100 and/or the PFN 200 for generating a patterned pulse from a plurality of charges having an increased current, for example capacitor originated charges.

The process 500, which is optionally implemented by any of the PFN 100 and the PFN 200, is based, as shown at 502, on charging a plurality of capacitor units such as the capacitor units 104 with a plurality of electrical charges. The charging that is optionally done with low current charges is conducted to load the capacitor units 104 with a number of different increased current electrical charges.

As shown at 504, a sequence defining a discharge order of a plurality of electrical charges is controlled by a control unit such as the control unit 122 according to, for example, one or more instructions which may be received from the CPU, computed by the control unit 122, extracted from a memory of the control unit 122 and/or the like. The order is defined according to a desired energizing pulse having a predetermined pattern. The predetermined pattern defines a multi-level voltage waveform such as, for example, a square waveform. The waveform includes a number of different voltages levels. The voltage level may increase, decrease and/or changed in a sinusoidal manner over time. Such a sequence, or instructions for generating such a sequence, may be referred to herein as a discharging sequence. Optionally, the discharging sequence is provided to the control unit 122, for example by hardware and/or software modules which are connected thereto.

As shown at 506, the plurality of charged capacitor units 104 are sequentially discharged, one at the time or one or more in each time, to a common load, specifically the load 124 via the common passive output circuit 110. The discharging is performed according to the discharging sequence. For example, in use, the control unit 122 operates the switches 106 to set them in the SHORT/OPEN states according to the discharging sequence.

As shown at 508, the process 500 may be repeated in any number of iterations. The discharging sequence may be changed or remain unchanged during the various iterations. The discharging sequence controlled by operating the switches 106 allows delivering energized pulses in various patterns. One or more of the plurality of capacitor units 104 may therefore be iteratively charged and discharged according to the discharging sequence to form the waveform of the patterned energized pulses.

Figure 6A:
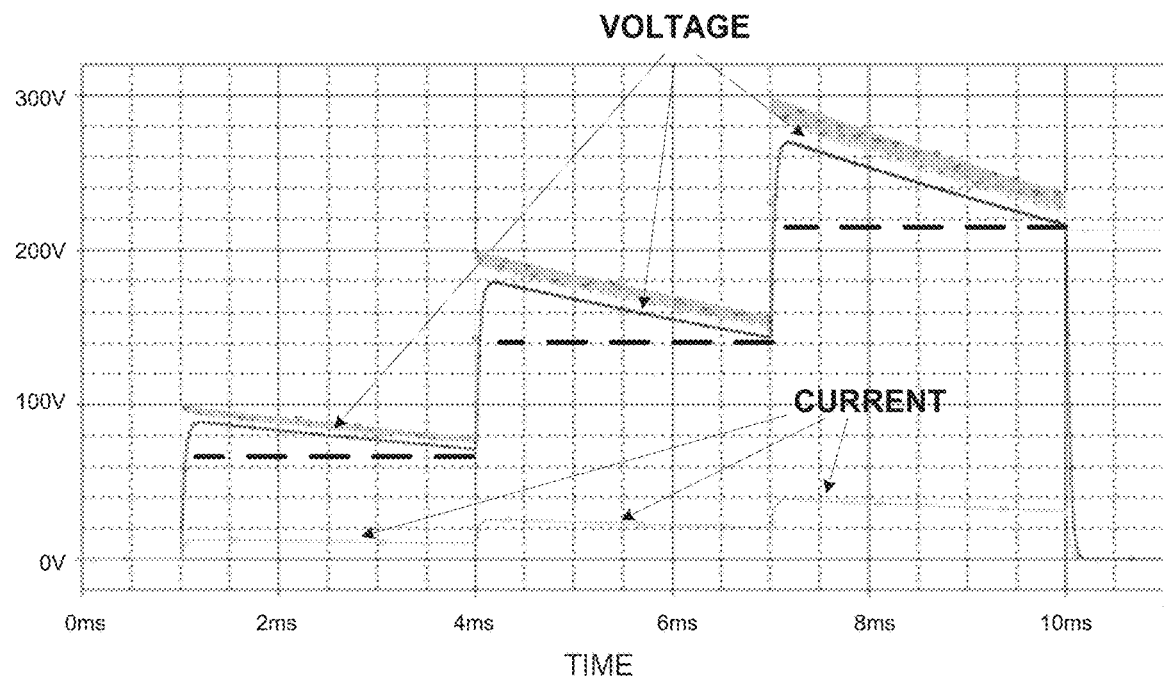
FIG. 6A, FIG. 6B, FIG. 6C, FIG. 6D and FIG. 6E are graphs depicting simulations of increasing, decreasing and gradually decreasing square waveforms which are generated according to the process depicted in FIG. 5 and/or by the PFNs depicted in FIG. 1A and/or FIG. 2A, according to some embodiments of the present invention.
Figure 6B:
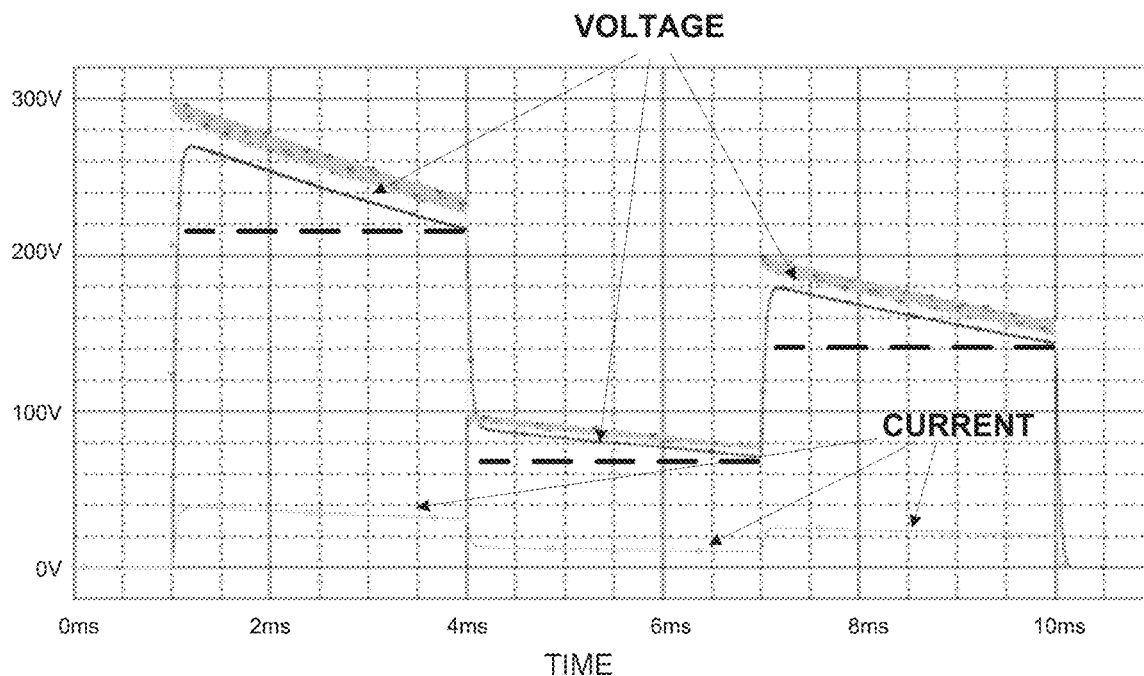
Figure 6C:
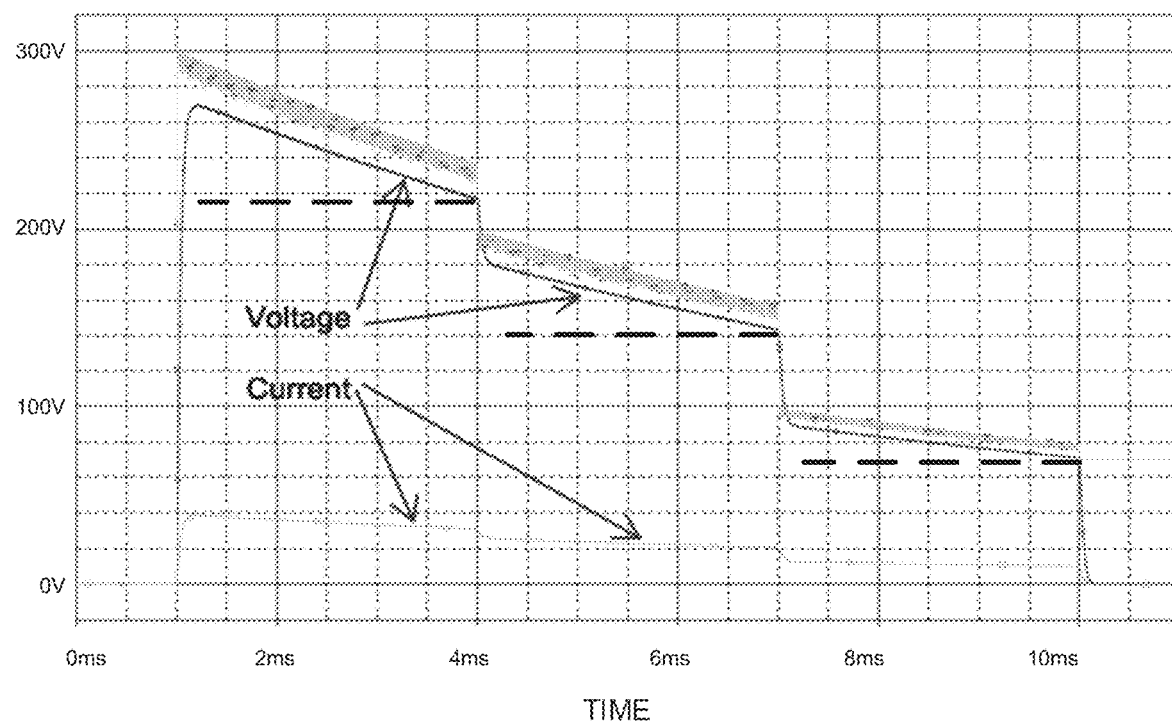

For example, FIG. 6A. FIG. 6B, FIG. 6C, FIG. 6D and FIG. 6E are graphs depicting simulations of increasing decreasing and gradually decreasing square waveforms which are generated according to the process 500 utilizing the PFN 100 and/or the PFN 200. In the graphs in FIG. 6A, FIG. 6B and FIG. 6C, the upper sloping lines emulate the change in the voltage level during the delivery of each discharge released by the capacitor units 104, the lower slopping lines emulate the change in the current during the delivery of each discharge via the common passive output circuit 110 and the brown dashed lines emulate an estimated voltage level of each one of the discharges delivered to the load 124 via the common passive output circuit 110.

Figure 6D:
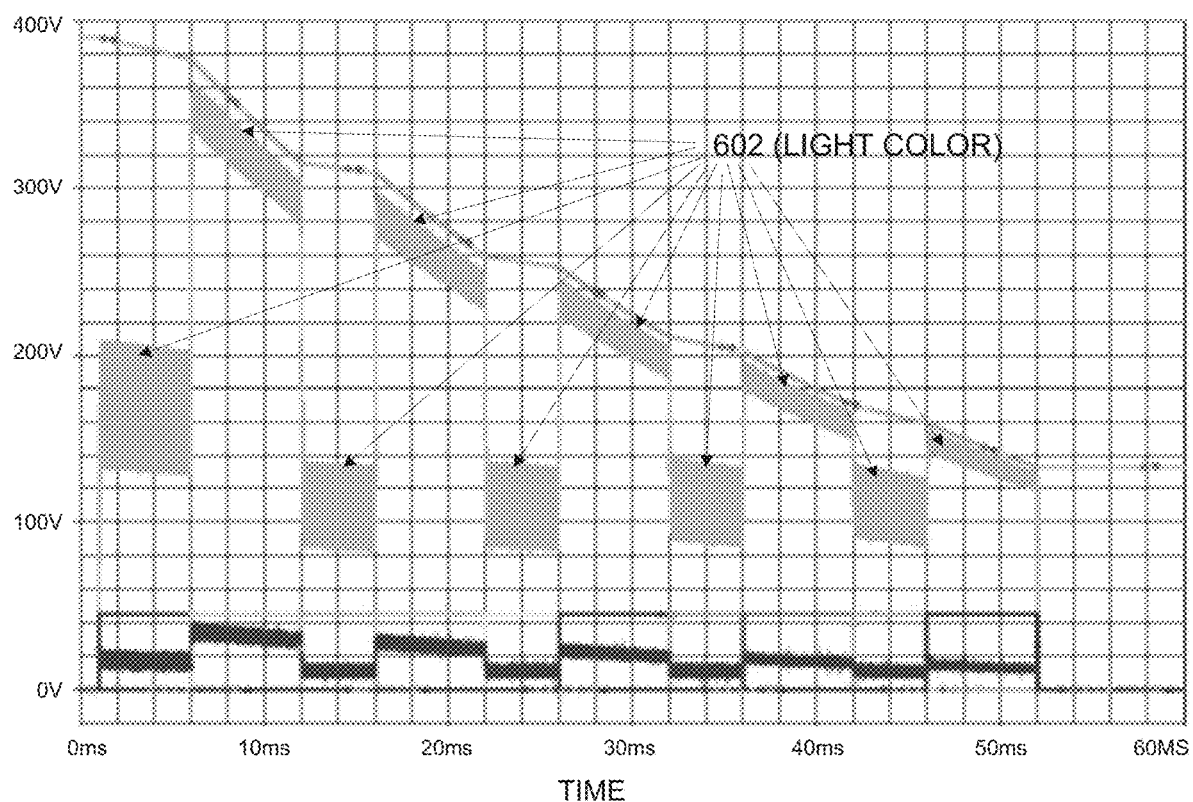

FIG. 6D presents a graph chart of an exemplary regulated energized pulse 602 (marked light color) which may be generated by the PFN 100 and/or the PFN 200 operated by a controller such as the control unit 122, specifically for driving a Xenon lamp of an IPL device. The regulated energized pulse 602 may be highly effective for the IPL device since in response to the regulated energized pulse 602, the Xenon lamp of the IPL device may emit light pulses having a pattern highly efficient for heating a treatment surface during an IPL treatment.

The regulated energized pulse 602 has a multi-level voltage waveform pattern comprising a sequence of five pulses spread over a time period of about 50 ms (milliseconds). The sequenced pulses may be generated by multiple modules such as the modules 102 of the PFN 100 and/or the PFN 200 which may discharge the energy stored in their respective capacitor units such as the capacitor units 104. The voltage and/or current discharged from each capacitor unit 104 may be regulated by the respective electrical regulator constructed of the respective module 102 and the common passive output circuit 110.

Figure 6E:
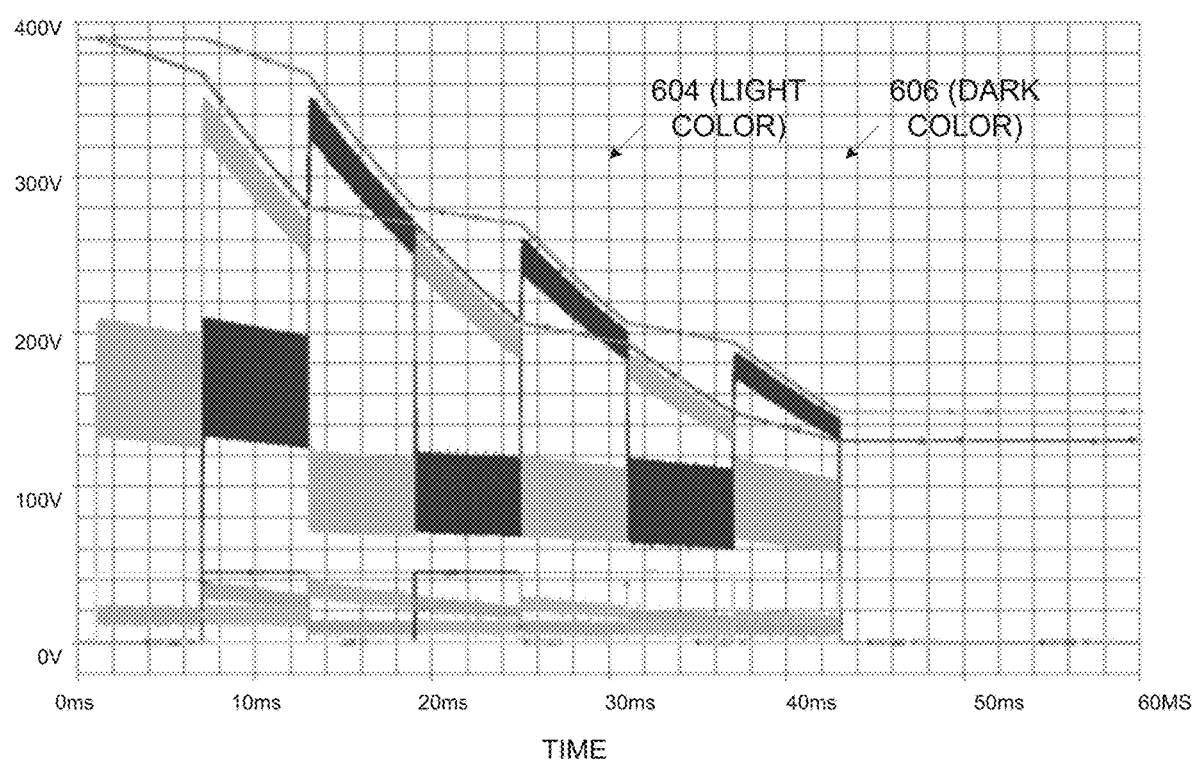

FIG. 6E presents a graph chart of two exemplary regulated energized pulses 604 (marked light color) and 606 (marked dark color) which may be generated by the PFN 100 and/or the PFN 200 operated by a controller such as the control unit 122, specifically for driving two Xenon lamps of an IPL device which are operated alternately over the same treatment area. Generating and driving the two regulated energized pulses 604 and 606 may yield combined light pulses emitted by the two lamps which may sufficient heat the treatment area for the IPL treatment while significantly reducing the energy required for driving each of the lamps thus reducing the energy required from the PFN 100 and/or the PFN 200.

Similarly to as described for the regulated energized pulse 602, each of the regulated energized pulses 604 and 606 has a multi-level voltage waveform pattern comprising a sequence of five pulses spread over a time period of about 50 ms (milliseconds). Each of the regulated energized pulses 604 and 606 may be generated by a separate set of modules 102 which are operated by the control unit 122 to discharge the energy stored in their respective capacitor units 104. As described for the regulated energized pulse 602, the voltage and/or current discharged from each capacitor unit 104 may be regulated by the respective electrical regulator constructed of the respective module 102 and the common passive output circuit 110.

According to some embodiments of the present invention, the control unit 122 monitors the functionality of each one of the capacitor units 104. The monitoring is optionally performed by sampling the pulse generated by the PFN 100 and/or the PFN 200.

Optionally, the control unit 122 is coupled to monitor a charging rate in some or all of the capacitor units 104 and outputs an indication indicating which of the capacitor units 104, if any, does not charge properly. In some embodiments, the control unit 122 compares the waveform of the generated pulse with a reference pulse, such as a previously recorded waveform and/or reference waveform. Optionally, waveforms of output pulses are sampled and recorded occasionally, in a synchronized or an unsynchronized manner, for example by the control unit 122 which is optionally connected to the output of the common passive output circuit 110. The recorded waveforms are used as reference waveforms which are matched with the waveform of the currently generated pulse to determine its accuracy, for example by identifying one or more deviations in the pulse compared to one or more the reference pulse(s). Based on an analysis of a detected deviation, the control unit 122 may identify one or more capacitor units 104 which discharge charges that are not coordinated with one or more previously released charges. As the discharging sequence of the capacitor units 104 is known, the analysis of the pulse may be used to evaluate, separately, the accuracy of each capacitor unit 104. For example, assuming a deviation is detected in a segment of the waveform that is formed by a third charge, the capacitor unit 104 that has been operated in the third discharging session may be determined to malfunction and an indication may be outputted to the operator, for example by operating one or more indicative LEDs or a display which is connected and operated by the control unit 122.

According to some embodiments of the present invention, the control unit 122 is connected to one or more sensors which monitor the functioning of the energized load 124. For example, if the load 124 is a flash lamp, heat and/or illumination may be verified using a temperature sensor and/or a spectrometer and/or photodiode. In another example, in case the load 124 is a microwave oscillator, frequency stability may be checked using a frequency reader. In such embodiments, a control module that is designed to compute the regularity of the PFN 100 and/or the PFN 200 may be formed. Moreover, the energized pulse driven by the PFN 100 and/or the PFN 200 to the load 124 may be adjusted according to the readings of the sensor(s).

Optionally, one or more of the plurality of capacitor units 104 and/or the plurality of modules 102 are detachably connected to a supporting element, such as a board, which supports all the components of PFN 100 and/or the PFN 200. In such an embodiment, an operator may disconnected and replace one or more of the capacitor units 104 and/or the modules 102 when a malfunction is indicated by the control unit 122. This allows a laymen or an unskilled technician to maintain and/or repair the PFN 100 and/or the PFN 200 without having to send the PFN 100, the PFN 200 and/or a device which contains the PFNs to a laboratory and/or without having to dispose the PFNs when not all the modules are defective.

According to some embodiments of the present invention, the power source(s) 120 comprise a fly-back power circuit controlled by a fly-back power controller adapted to control conversion of a rectified alternating input current received from an alternating power source, for example, mains power to a direct current as known in the art for charging the plurality of the capacitor units 104. The rectified alternating input current which may typically be rectified by a diode bridge to produce a single polarity current as known in the art. In typical applications, the fly-back power controller is typically powered from a branch of the primary side of a transformer used to apply galvanic separation between the primary side connected to the power source(s) 120 driven from the alternating power source and the secondary side connected to the capacitor units 104. The voltage on the transformer branch powering the fly-back power controller is built with direct relation to the voltage on the secondary side.

In order to at least partially suppress and/or attenuate transients in the current driven to the capacitors units 104 on the secondary side, some existing fly-back implementations are deployed with current and transient suppressing devices placed to suppress such transients in the primary side. Other existing fly-back implementations may apply current limiting to the secondary side current which may significantly suppress and/or attenuate the transients thus reducing and potentially eliminating the need for the transient suppressing devices thus significantly reducing design complexity and/or increase reliability of the PFN 100, the PFN 200 and/or the PFN 400. In addition, reducing and optionally removing the transient suppressing devices may significantly reduce cost of the PFN 100, the PFN 200 and/or the PFN 400.

Since the voltage on the secondary side is gradually building up, the voltage of the transformer branch which powers the fly-back power controller therefore follows the gradual build up until reaching the operational voltage level of the fly-back power controller and the fly-back power controller starts operating to generate the direct current driven to charge the capacitor units 104. Since the secondary side current may typically be limited to prevent current transients and fluctuations and since the voltage of the transformer branch powering the fly-back power controller follows the voltage build up in the secondary side, the voltage driven to the fly-back power controller is building up significantly slowly thus significantly prolonging the charging sequence of at least some of the capacitor units 104 and extending the charging time.

According to some embodiments of the present invention, the fly-back power controller is powered by an independent auxiliary power converter adapted to convert the rectified alternating input current to a direct current configured to power the fly-back power controller. This is in contrast to the typical existing fly-back implementations in which the fly-back power controller is powered from a branch of the transformer in which the voltage is directly proportional to the current in the secondary side and is hence slowly building up. Using the independent auxiliary power converter may therefore significantly reduce the build-up time for the voltage driven to power the fly-back power controller, in particular during a first power-on of the fly-back circuit and hence significantly reduce the charge time of the capacitor units 104.

Reference is now made to FIG. 7A, which is a schematic illustration of an exemplary isolated power supply comprising a fly-back power controller powered by an independent auxiliary power converter, according to some embodiments of the present invention. An exemplary power supply such as the power supply 120 which for clarity is presented in very high level may utilize a fly-back circuit 704 comprising a transformer 710 to form a galvanic separation between the primary circuit, i.e. the input power and the secondary side, i.e. the capacitor units 104. The fly-back circuit 704 receives an alternating current (AC) rectified by a diode bridge 702 as known in the art to create a direct current on the primary side of the transformer 710 which is transferred to the secondary side of the transformer 710, i.e. to the capacitor unit(s) 104 under control of a fly-back power controller 716 to generate a desired voltage level of the direct output current. On the secondary side of the transformer 710 the capacitor unit(s) 104 is connected to the transformer 710 via a diode 712, specifically an anti-reversing diode. The current going through the primary side of the transformer 710 is alternatingly switched SHORT and OPEN by a switch 714 controlled by a fly-back power controller 716 to generate a desired voltage level of the direct output current.

An independent auxiliary power converter 720 powered by the alternating current and/or another direct current (e.g. the rectified direct current, etc.) may be configured to generate power for the fly-back power controller 716. The auxiliary power converter 720 may be, for example, a linear power converter, specifically a low voltage linear power converter which rapidly produces an output voltage level required to power the fly-back power controller 716. As such the fly-back power controller 716 may receive its nominal power and enter its normal operation mode immediately after the alternating current is driven into the power supply 120 and hence into the auxiliary power converter 720. As such the fly-back circuit 704 controlled by the fly-back power controller 716 may rapidly start charging the capacitor unit(s) 104 to the working voltage required for the capacitor unit(s) 104.

Optionally, the fly-back power controller 716 indicates entering its normal operation mode, for example, by switching ON a LED indicator.

Reference is now made to FIG. 7B which is a graph chart of a power up sequence of a legacy fly-back power controller circuit and FIG. 7C which is a graph chart of a power up sequence of a fly-back power controller powered by an independent auxiliary power converter, according to some embodiments of the present invention. As seen in FIG. 7B, a graph chart 750 presents a voltage 762A of a capacitor unit such as the capacitor unit 104 charged by an exemplary circuit controlled by a legacy fly-back power controller such as the fly-back power controller 716 which is powered from a branch of a transformer such as the transformer 710 in which a voltage 760A of the transformer branch follows the voltage buildup of the voltage 762A. Since the current on the secondary side is typically limited the buildup time of the voltage 762A is significantly slow. The voltage 760A which follows the buildup of the voltage 762A is therefore also significantly slow and oscillates until reaching the operational working voltage 764 of the fly-back power controller 716 at which time the fly-back power controller 716 starts operating properly to charge the capacitor unit(s) 104.

As seen in FIG. 7C, a graph chart 752 presents a voltage 762B of the capacitor unit 104 charged by an exemplary circuit in which the fly-back power controller 716 is powered by an independent auxiliary power converter such as the auxiliary power converter 720 generating a voltage 760B for the fly-back power controller 716 as described in FIG. 7A. Since the auxiliary power converter 720 generates the voltage 760B, the voltage 760B rapidly reaches the operational working voltage 764 of the fly-back power controller 716 and the fly-back power controller 716 very quickly (following startup) starts operating properly to charge the capacitor unit(s) 104.

As evident from the graphs 750 and 752, powering the fly-back power controller 716 from the auxiliary power converter 720 may significantly reduce the buildup time for the voltage 760B of fly-back power controller 716 which in turn starts operating to charge the capacitor unit(s) 104 thus significantly reducing the charge time of the capacitor unit (s) 104.

According to some embodiments of the present invention, the power source(s) 120 may comprise a non-isolated buck-boost converter controlled by one or more controllers, for example, the control unit 122 for converting the input power voltage to one or more working voltages required for charging the capacitor units 104. Since the buck-boost converter support a wide dynamic range of input and output voltages, the power source(s) 120 may be able to receive a wide range of input power voltages and generate a wide range of working voltages required for charging the capacitor units 104.

Reference is now made to FIG. 8A and FIG. 8B, which are schematic illustrations of an exemplary electric circuit of a buck-boost converter wired to connect a high rail and a low rail respectively of a power source such as the power source 120 to a capacitor unit such as the capacitor unit 104, according to some embodiments of the present invention. Naturally, regardless of switching the high or low rail of the power source 120, the buck-boost converter generates a similar voltage having a similar voltage rising slope.

As seen in FIG. 8A, a high rail buck-boost converter 802 is constructed and wired with a buck switch S1 serving as a decoupling buck switch which is configured to connect/disconnect (electrically couple/decouple) the high side of the power source 120 to the capacitor unit 104. The buck switch S1 may be controlled by a control unit, for example, the control unit 122 which may operate a PWM circuit V2 to set (trigger) the charging buck switch S1 into SHORT/OPEN states alternately in a duty cycle (pulse width) constructed to generate a desired working voltage level for charging the capacitor unit 104 and load the capacitor unit 104 with its defined charge. Optionally, another charging switch S2 serving as a decoupling boost switch is placed to enable/disable the boost circuit of the buck-boost converter 802 by setting the decoupling boost switch S2 in constant OPEN state thus constantly disconnecting (electrically decoupling) the boost converter from the capacitor unit 104 and operating the buck-boost converter 802 in buck only mode. Complementary, by setting the buck switch S1 to the OPEN state, the buck circuit of the buck-boost converter 802 may be disabled and the buck-boost converter 802 may be operated in boost only mode.

As seen in FIG. 8B, a low rail buck-boost converter 804 is constructed and wired with a buck switch S4 serving as a decoupling buck switch which is configured to connect/disconnect (electrically couple/decouple) the low side of the power source 120 to the capacitor unit 104. The buck switch S4 may be controlled by a control unit, for example, the control unit 122 which may operate a PWM circuit V4 to set (trigger) the buck switch S4 into SHORT/OPEN states alternately in a duty cycle (pulse width) constructed to generate a desired working voltage level for charging the capacitor unit 104 and load the capacitor unit 104 with its defined charge. Optionally, another charging switch S3 serving as a boost decoupling switch is placed to enable/disable the boost circuit of the buck-boost converter 804 by setting the decoupling switch S3 in switch constant OPEN state thus constantly disconnecting (electrically decoupling) the boost converter from the capacitor unit 104 and operating the buck-boost converter 804 in buck only mode.

Complementary, by setting the buck switch S4 to the OPEN state, the buck circuit of the buck-boost converter 804 may be disabled and the buck-boost converter 804 may be operated in boost only mode.

Operating the buck-boost converter 804 in buck-boost mode may allow high flexibility in generating a wide range of output voltages for charging the capacitor unit(s) 104. Moreover, operating the buck-boost converter 804 in buck-boost mode may support rapid generation of the output voltage with low stress during the entire charging sequence from its very beginning.

The control unit 122 may operate the PWM circuit such as the PWM circuits V2 and/or V4 with a pulse width selected to generate a certain voltage level (charge) and having a characteristic voltage rising slope. By applying different and/or varying PWM pulse widths (duty cycle), the control unit 122 may therefore charge the capacitor unit(s) 104 with different charges, i.e. working voltage(s) as set different voltage rising slopes. When the control unit 122 applies a single constant PWM pulse width during the entire charging sequence, the voltage rising slope may be initially non-linear and may become more linear as the voltage rises.

Reference is now made to FIG. 9, which is a graph depicting a plurality of voltage rising slopes of a voltage generated by a buck-boost converter such as the buck-boost converter 802 and/or the buck-boost converter 804 operated with different PWM pulse widths, according to some embodiments of the present invention. As seen in the graph in which the X-axis is the time in seconds (s) and the Y-axis is the voltage in Kilovolts (KV), different PWM pulse widths measured in microseconds (us) are associated with different graphs resulting in different final voltage levels and different voltage rising slopes. As seen, shorter PWM pulse widths are characterized with lower final working voltage, i.e. the lower charges loaded in the capacitor unit 104 and less steep initial segments of the voltage rising slopes. Increasing the PWM pulse width, increases the final working voltage of the charged capacitor unit 104 and the initial segment of the voltage rising slope becomes steeper.

According to some embodiments of the present invention, the buck-boost converter 802 and/or 804 is controlled by one or more controllers, for example, the control unit 122 to charge the capacitor units 104 with an approximately linearly rising voltage level. The control unit 122 may dynamically adjust the PWM pulse-width to dynamically alter the voltage rising slope of the voltage generated by the buck-boost converter 802 and/or 804 for charging the capacitor unit(s) 104. In particular, the control unit 122 may gradually increase the PWM pulse width to achieve a linear approximate for the voltage rising slope. Charging the capacitor units 104 with a linearly rising voltage slope may significantly reduce damage to the capacitor units 104 and may therefore increase reliability and/or longevity of the capacitor units 104. Moreover, charging the capacitor units 104 with a linearly rising voltage slope may allow using lower grade capacitors for one or more of the capacitor units 104 thus reducing cost of the PFN 100 and/or the PFN 200 and/or the PFN 400.

Reference is now made to FIG. 10, which is a graph depicting linear voltage rising slopes constructed by dynamically adjusting a PWM pulse width controlling a buck-boost converter such as the buck-boost converter 802 and/or the buck-boost converter 804, according to some embodiments of the present invention. As seen in the graph in which the X-axis is the time in seconds (s) and the Y-axis is the voltage in Kilovolts (KV), different PWM pulse widths measured in microseconds (us) are associated with different graphs resulting in different final voltage levels and different voltage rising slopes. In order to charge the capacitor units 104 with a substantially linear charging current and voltage, the control unit 122 may dynamically adjust the PWM pulse width thus causing the voltage rising slope to dynamically increase to become approximately linear. For example, assuming a certain capacitor unit 104 is defined to be charged to a 600V working voltage. In such case, the control unit 122 may dynamically adjust the PWM pulse width to cause the voltage rising slope to follow line B. The control unit 122 may therefore gradually increase the PWM pulse to follow a substantially liner voltage rising slope. For example, the control unit 122 may initially set the PWM pulse width to 3 us and after a certain time (e.g. 20 milliseconds (ms)) increase the PWM pulse width to 6 us, after another certain time (e.g. 40 ms) increase the PWM pulse width to 9 us, after another certain time (e.g. 75 ms) increase the PWM pulse width to 12 us, after another certain time (e.g. 150 ms) increase the PWM pulse width to 15 us and so on until finally setting the PWM pulse width to 42 us when the voltage level reaches 600V.

According to some embodiments of the present invention, the control unit 122 operates the buck-boost converter 802 and/or 804 in buck only mode, specifically during the initial build-up of the voltage level generated to charge the capacitor unit 104. Operating the buck-boost converter 802 and/or 804 in buck only mode may significantly reduce the in-rush current going into the capacitor units 104 thus significantly reducing potential damage to the capacitor units 104 and may therefore increase reliability and/or longevity of the capacitor units 104. Moreover, reducing the in-rush current may allow using lower grade capacitor for one or more of the capacitor units 104 thus reducing cost of the PFN 100 and/or the PFN 200.

The control unit 122 operates the buck-boost converter 802 and/or 804 in buck only mode by operating the charging switch S1 in the high rail buck-boost converter 802 or the charging switch S4 in the low rail buck-boost converter 804 to be constantly in SHORT state thus disabling operation of the boost circuit of the buck-boost converter. The control unit 122 may operate the charging switch S2 in the high rail buck-boost converter 802 or the charging switch S3 in the low rail buck-boost converter 804 to alternately switch between the SHORT and OPEN states to generate a desired voltage for charging the capacitor unit(s) 104.

Reference is now made to FIG. 11A, which is a graph depicting a plurality of voltage rising slopes of a voltage generated by a buck-boost converter operated such as the buck-boost converter 802 and/or the buck-boost converter 804 in buck only mode with different PWM pulse widths, according to some embodiments of the present invention. Reference is also made to FIG. 11B, which is a graph depicting a plurality of voltage rising slopes of a voltage generated by a buck-boost converter such as the buck-boost converter 802 and/or the buck-boost converter 804 operated in boost only mode with different PWM pulse widths, according to some embodiments of the present invention. In both graphs, the X-axis is the time in seconds (s) and the Y-axis is the voltage in hundreds of Volts.

As seen in FIG. 11A, when operated in buck only mode, the voltage generated by the buck-boost converter 802 and/or 804, specifically the initial segment of the voltage rising slope when the buck-boost converter 802 and/or 804 starts charging the capacitor unit(s) 104, is characterized by a significantly steady voltage rise and hence steady current rise. In contrast, as seen in FIG. 11B, when operated in boost only mode, the voltage generated by the buck-boost converter 802 and/or 804, specifically the initial segment of the voltage rising slope when the buck-boost converter 802 and/or 804 starts charging the capacitor unit(s) 104, is characterized by a major initial current driven out of the buck-boost converter 802 and/or 804 to the capacitor unit(s) 104. This high and abrupt current may lead to major in-rush current effects which as described herein before may significantly damage the capacitor units 104 and thus reduce reliability and/or longevity of the capacitor units 104.

Therefore, by operating the buck-boost converter 802 and/or 804 in buck only mode, specifically during the initial charging sequence, may significantly reduce potential damage to the capacitor units 104 and may thus increase reliability and/or longevity of the capacitor units 104.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant devices and methods will be developed and the scope of the terms a capacitor, an electric regulator, a switch and a supporting element are intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, an instance or an illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

The word "exemplary" is used herein to mean "serving as an example, an instance or an illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

In addition, any priority document(s) of this application is/are hereby incorporated herein by reference in its/their entirety.

What is claimed is:

1. A pulse forming network (PFN) for driving Xenon pulse lamps, comprising:
   a single common passive output circuit utilizing a current source output circuit comprising an inductor connected in series to at least one Xenon pulse lamp and an anti-reversing diode connected in parallel to the inductor and the at least one Xenon pulse lamp;

a plurality of capacitor units set to store a plurality of electrical charges in a plurality of working output voltages;

a plurality of switches, each adapted to electrically couple a respective one of the plurality of capacitor units to the common passive output circuit electrically connecting all the switches to the at least one Xenon pulse lamp, wherein each of the plurality of switches is configured to form, when electrically connecting a respective one of the plurality of capacitor units to the single common passive output circuit, one of a plurality of buck converters regulating a discharge level of the plurality of capacitor units; and a control unit adapted to operate the plurality of switches to discharge the plurality of charges into the at least one Xenon pulse lamp, via the common passive output circuit, in a sequence ordered to form a regulated energizing pulse, over a time period, having a desired gradually decreasing multi-level voltage waveform comprising a plurality of gradually decreasing high voltage level segments in a first voltage level range having a first maximum level and a plurality of low voltage level segments in a second voltage level range having a second maximum level falling below the first maximum level, wherein the plurality of gradually decreasing high voltage level segments and the plurality of low voltage level segments are alternating with one another, wherein an entirety of the plurality of gradually decreasing high voltage level segments having, when combined, a voltage level which gradually decreases continuously over the time period across the entirety of the plurality of high voltage level segments, wherein the desired multi-level voltage waveform is constructed from the plurality of different working output voltages;

wherein the at least one Xenon pulse lamp emits light pulses having a pattern corresponding to the regulated energizing pulse.

2. The PFN of claim 1, wherein each of the plurality of capacitor units is energized by a power source adapted to a respective one of the plurality of working output voltages.

3. The PFN of claim 1, wherein at least one of the plurality of switches is configured to electrically couple a low rail of a respective capacitor unit to the common passive output circuit.

4. The PFN of claim 1, wherein at least one of the plurality of switches is configured to electrically couple a high rail of a respective capacitor unit to the common passive output circuit.

5. The PFN of claim 1, wherein the energizing pulse having a square waveform.

6. The PFN of claim 1, wherein each of the plurality of switches is configured to couple a respective one of the plurality of capacitor units via an anti-reverse diode.

7. The PFN of claim 1, wherein the control unit is adapted to sequentially trigger the plurality of switches to receive a respective one of the plurality of electrical charges from a respective one of the plurality of capacitor units in a sequential order, forming the energizing pulse.

8. The PFN of claim 1, wherein the control unit is adapted to simultaneously trigger a number of the plurality of switches to simultaneously receive multiple electrical charges from the number of capacitor units simultaneously, forming the energizing pulse.

9. The PFN of claim 8, wherein the control unit receives a requested charge level for the at least one Xenon pulse lamp and selects the number of switches according to the requested charge level.

10. The PFN of claim 1, wherein the control unit is adapted to monitor the pulse to identify a deviation of the waveform from at least one of a reference pulse and a previously recorded pulse generated by the PFN.

11. The PFN of claim 10, wherein the control unit identifies a malfunction in at least one of the plurality of capacitor units according to an analysis of the waveform deviation and outputs an indication which indicates which of the plurality of capacitor units malfunctions.

12. The PFN of claim 1, wherein at least one of the plurality of capacitor units is detachably connected to a supporting structure.

13. The PFN of claim 1, wherein each of the plurality of capacitor units is iteratively charged.

14. The PFN of claim 1, further comprising at least one charging unit electrically coupled to the plurality of capacitor units, wherein the plurality of capacitor units are charged by the at least one charging unit, the at least one charging unit is operated by the control unit to charge the plurality of capacitor units with a plurality of electrical charges having a plurality of voltages.

15. The PFN of claim 14, wherein the at least one charging unit comprises a fly-back power controller adapted to control conversion of a rectified alternating input current to a direct current used for charging the plurality of capacitor units, the direct current is applied with current limiting to at least partially attenuate transients in the direct current, the fly-back power controller is powered by an independent auxiliary power converter adapted to convert the rectified alternating input current to a direct current configured to power the fly-back power controller.

16. The PFN of claim 14, wherein the at least one charging unit comprises a buck-boost converter.

17. The PFN of claim 16, wherein the control unit operates the buck-boost converter to charge the plurality of capacitor units with an approximately linearly rising voltage level.

18. The PFN of claim 16, wherein the buck-boost converter is electrically coupled to a respective one of the plurality of capacitor units via a charging switch triggered by the control unit according to a respective electrical charge defined for the respective capacitor unit.

19. The PFN of claim 18, wherein the charging switch is configured to electrically couple a low rail of the buck-boost converter to the respective capacitor unit.

20. The PFN of claim 18, wherein the charging switch is configured to electrically couple a high rail of the buck-boost converter to the respective capacitor unit.

21. The PFN of claim 16, wherein a boost circuit of the buck-boost converter is disabled by operating a switch of the buck-boost converter to constantly electrically couple the boost circuit to the respective capacitor unit.

22. A method of generating a patterned pulse for driving Xenon pulse lamps, comprising:

using a control unit of a Pulse Forming Network (PFN), the control unit is adapted for:

(a) charging a plurality of capacitor units with a plurality of charges in a plurality of different working output voltages; and (b) sequentially coupling the plurality of charged capacitor units to a single common passive output circuit utilizing a current source output circuit electrically connecting all the capacitor units to at least one Xenon pulse lamp so as to allow delivering a regulated energizing pulse, over a time period, having a desired gradually decreasing multi-level voltage waveform to the at least one Xenon pulse lamp, the regulated energizing pulse comprises a plurality of gradually decreasing high voltage level segments in a first voltage level range having a first maximum level and a plurality of low voltage level segments in a second voltage level range having a second maximum level falling below the first maximum level, wherein the plurality of gradually decreasing high voltage level segments and the plurality of low voltage level segments are alternating with one another, wherein an entirety of the plurality of gradually decreasing high voltage level segments having, when combined, a voltage level which gradually decreases continuously over the time period across the entirety of the plurality of high voltage level segments;

wherein the desired multi-level voltage waveform is constructed from the plurality of different working output voltages;

wherein the at least one Xenon pulse lamp emits light pulses having a pattern corresponding to the regulated energizing pulse;

wherein the common passive output circuit comprises an inductor connected in series to the at least one Xenon pulse lamp and an anti-reversing diode connected in parallel to the inductor and the at least one Xenon pulse lamp;

wherein the coupling of a respective one of the plurality of charged capacitor units to the single common passive output circuit forms one of a plurality of buck converters regulating a discharge level of the plurality of capacitor units.

23. The method of claim 22, further comprising the control unit is adapted to repeat the operations (a) and (b) so as to charge the at least one Xenon pulse lamp continuously.

* * * * *